(12) United States Patent
Cao

(10) Patent No.: US 12,099,729 B2
(45) Date of Patent: Sep. 24, 2024

(54) VERIFY FAILBIT COUNT CIRCUIT, MEMORY DEVICE, MEMORY SYSTEM AND METHOD

(71) Applicant: YANGTZE MEMORY TECHNOLOGIES CO., LTD., Wuhan (CN)

(72) Inventor: Yi Cao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 29 days.

(21) Appl. No.: 18/090,384

(22) Filed: Dec. 28, 2022

(65) Prior Publication Data
US 2023/0147213 A1    May 11, 2023

Related U.S. Application Data

(63) Continuation of application No. PCT/CN2022/080770, filed on Mar. 14, 2022.

(30) Foreign Application Priority Data

Mar. 15, 2021    (CN) .......................... 202110275767.5

(51) Int. Cl.
G06F 3/06 (2006.01)

(52) U.S. Cl.
CPC .......... G06F 3/0625 (2013.01); G06F 3/0653 (2013.01); G06F 3/0679 (2013.01)

(58) Field of Classification Search
CPC ..... G06F 1/00; G06F 3/00; G06F 5/00; G06F 7/00; G06F 8/00; G06F 9/00; G06F 3/0625; G06F 3/0653; G06F 3/0679; G06F 2221/00; G06F 2219/00; G06F 2218/00; G06F 2216/00; G06F 2213/00; G06F 2212/00; G06F 2211/00; G06F 2209/00;
(Continued)

(56) References Cited

U.S. PATENT DOCUMENTS

2008/0043535 A1    1/2008    Roohparvar

FOREIGN PATENT DOCUMENTS

| CN | 101256838 A | 9/2008 |
|---|---|---|
| CN | 101783165 A | 7/2010 |

(Continued)

OTHER PUBLICATIONS

International Search Report issued in corresponding International Application No. PCT/CN2022/080770, mailed on Jun. 10, 2022, 5 pages.

*Primary Examiner* — Yong J Choe
(74) *Attorney, Agent, or Firm* — BAYES PLLC

(57) ABSTRACT

The present disclosure relates to a verify failbit count circuit, comprising: a highest bit counter configured to compare a verify standard signal with a verify failbit signal to generate a first comparison result, and output a first enable signal based on the first comparison result; a lowest bit counter configured to, in response to a first enable signal indicating to enable the lowest bit counter, compare the verify failbit signal with a first reference signal to generate a second comparison result, and output a second enable signal based on the second comparison result; and a first intermediate bit counter configured to, in response a the second enable signal indicating to enable the first intermediate bit counter, compare the verify failbit signal with a second reference signal to generate a third comparison result.

19 Claims, 21 Drawing Sheets

(58) Field of Classification Search
CPC ............ G06F 2207/00; G06F 2200/00; G06F 2123/00; G06F 2119/00; G06F 2117/00; G06F 2115/00; G06F 2113/00; G06F 2111/00; G06F 2101/00; G06F 40/00; G06F 30/00; G06F 21/00; G06F 18/00; G06F 17/00; G06F 16/00; G06F 13/00; G06F 12/00; G06F 11/00
See application file for complete search history.

(56) References Cited

FOREIGN PATENT DOCUMENTS

| | | | |
|---|---|---|---|
| CN | 104795093 | A | 7/2015 |
| CN | 112331255 | A | 2/2021 |
| CN | 112951309 | A | 6/2021 |

VERIFY FAILBIT COUNT CIRCUIT, MEMORY DEVICE, MEMORY SYSTEM AND METHOD

CROSS-REFERENCE TO RELATED APPLICATIONS

This application is a continuation of International Application No. PCT/CN2022/080770, filed on Mar. 14, 2022, which claims the benefit of priority to China Patent Application NO. 202110275767.5, filed on Mar. 15, 2021, both of which are incorporated herein by reference in their entireties.

FIELD OF TECHNOLOGY

The present disclosure relates to the field of integrated circuit manufacturing, and in particular to a verify failbit count circuit, memory device, memory system and method.

BACKGROUND

In order to overcome the limitations of two-dimensional memory devices, memory devices with three-dimensional (3D) structures have been developed and mass-produced in the industry, which improve integration density by three-dimensionally arranging memory cells on a substrate. In the production and manufacture of 3D NAND memory device, it is necessary to perform write verification on memory cells to count the number of memory cells that fail to be written or have errors, this process is referred to as verify failbit count (VFC). The circuit that performs VFC is correspondingly referred to as a VFC circuit, and operation of the VFC circuit consumes the power consumption of 3D NAND memory device, therefore, it is desirable to optimize the design of the VFC circuit to save power consumption.

SUMMARY

In view of this, the present disclosure provides a verify failbit count circuit, memory device, memory system and method for saving power consumption by selecting to turn on the most appropriate counter and turn off unnecessary counters.

In an aspect, the present disclosure provides a semiconductor memory verify failbit count circuit, comprising: a highest bit counter, a lowest bit counter and at least one intermediate bit counter, wherein: the highest bit counter is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit; the lowest bit counter is connected to the highest bit counter, and is configured to: receive the first enable signal, the verify failbit signal and the first reference signal; compare the verify failbit signal with the first reference signal to generate a second comparison result based on the first enable signal being enabled; output a second enable signal according to the second comparison result; a first intermediate bit counter of the at least one intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; wherein the first reference signal is the lowest bit standard signal that can be processed by the count circuit, and is less than the verify standard signal; the second reference signal is greater than the first reference signal, but less than the verify standard signal.

In another aspect, the present disclosure provides a verify failbit count method for a semiconductor memory, comprising: selecting one from at least two verify standard with different magnitudes as the verify standard signal for the highest bit; comparing the verify failbit signal with the verify standard signal to generate a result of the first comparison; outputting a first enable signal according to the result of the first comparison; determining whether to compare the verify failbit signal with the first reference signal based on the first enable signal; when it is determined that the verify failbit signal with the first reference signal can be compared based on the first enable signal, comparing the verify failbit signal with the first reference signal and generating a second comparison result; outputting a second enable signal according to the second comparison result; determining whether to compare the verify failbit signal with a second reference signal based on the second enable signal; when it is determined that the verify failbit signal and the second reference signal can be compared based on the second enable signal, comparing the verify failbit signal with the second reference signal and generating a third comparison result; wherein the first reference signal is the lowest bit standard signal that can be processed by the count circuit, and is less than the verify standard signal; the second reference signal is greater than the first reference signal, but less than the verify standard signal.

In yet another aspect, the present disclosure provides a memory device, including a memory array and a peripheral circuit for controlling the memory array, wherein, the peripheral circuit includes a semiconductor memory verify failbit count circuit, the count circuit comprising: a highest bit counter, a lowest bit counter and at least one intermediate bit counter, wherein: the highest bit counter is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit; the lowest bit counter is connected to the highest bit counter, and is configured to: receive the first enable signal, the verify failbit signal and the first reference signal; compare the verify failbit signal with the first reference signal to generate a second comparison result based on the first enable signal being enabled; output a second enable signal according to the second comparison result; a first intermediate bit counter of the at least one intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; wherein the first reference signal is the lowest bit standard signal that can be processed by the count circuit, and is less than the verify standard signal; the second reference signal is greater than the first reference signal, but less than the verify standard signal.

In yet another aspect, the present disclosure provides a memory system including a memory and a controller for controlling the memory, wherein the memory device includes a memory array and a peripheral circuit for controlling the memory array, wherein, the peripheral circuit includes a semiconductor memory verify failbit count circuit, the count circuit including: a highest bit counter, a lowest bit counter and at least one intermediate bit counter, wherein: the highest bit counter is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit; the lowest bit counter is connected to the highest bit counter, and is configured to: receive the first enable signal, the verify failbit signal and the first reference signal; compare the verify failbit signal with the first reference signal to generate a second comparison result based on the first enable signal being enabled; output a second enable signal according to the second comparison result; a first intermediate bit counter of the at least one intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; wherein the first reference signal is the lowest bit standard signal that can be processed by the count circuit, and is less than the verify standard signal; the second reference signal is greater than the first reference signal, but less than the verify standard signal.

The present disclosure provides verify failbit count circuit, memory device, memory system and method. The count circuit employs the highest bit counter, the lowest bit counter and at least one intermediate bit counter to cooperate with each other, select to turn on the most appropriate counter and turn off unnecessary counters according to relationship between magnitudes of verify failbit signal and different reference currents, so that the power consumption of the count circuit can be saved to the greatest extent.

BRIEF DESCRIPTION OF THE DRAWINGS

To make the purposes, features and advantages of the present disclosure described above more apparent and understandable, the detailed description of the present disclosure will be described in detail below in conjunction with the accompanying drawings, in which.

DETAILED DESCRIPTION

Figure 1:
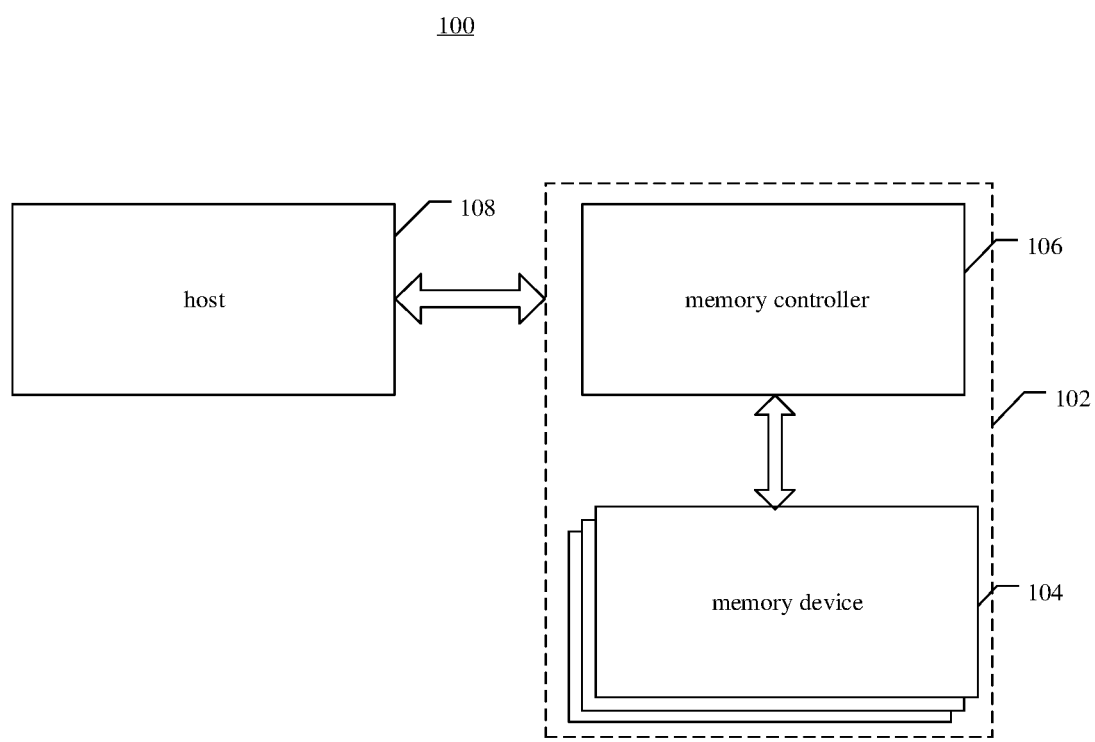
FIG. 1 is a block diagram of an exemplary system with memory devices according to some aspects of the present disclosure.

To make the purposes, features and advantages of the present disclosure described above more apparent and understandable, the detailed description of the present disclosure will be described in detail below in conjunction with the accompanying drawings.

Many specific details are set forth in the following description to facilitate a full understanding of the present disclosure, but the present disclosure may also be implemented in other ways than those described here, therefore the present disclosure is not limited by the specific implementations disclosed below.

As indicated in the present disclosure and claims, the terms "a", "an", "a kind" and/or "the" are not intended to refer to the singular and may include the plural unless the context clearly suggests an exception. Generally speaking, the terms "comprising" and "including" only indicate the inclusion of clearly identified steps and elements, and these steps and elements do not constitute an exclusive list, and the method or device may also include other steps or elements.

When describing implementations of the present disclosure in detail, for the easy of explanation, the cross-sectional view showing the device structure will not be partially enlarged according to the general scale, and the schematic diagram is only an example, which should not limit the claimed scope of the present disclosure. In addition, the three-dimensional space dimensions of length, width and depth should be included in actual production.

For ease of description, the spatial relation terms such as "beneath", "below", "lower", "under", "above", "on", etc., can be used herein to describe the relationship between one element or feature and another element(s) or feature(s) as illustrated in the figures. It can be understood that the spatial relation terms are intended to encompass different orientations of the device in use or operations in addition to the orientation depicted in the figures. For example, if the device in the figures is turned over, elements described as "below" or "beneath" or "under" other elements or features would then be oriented "above" the other elements or features. Thus, the exemplary terms "below" and "under" may encompass both directions of up and down. The devices can be otherwise oriented (rotated 90 degrees or at other orientations) and the spatial relation descriptors used herein should be interpreted accordingly. In addition, it will also be understood that when a layer is referred to as being "between" two layers, it can be the only layer between the two layers, or one or more intervening layers may also be present.

In the context of this disclosure, a described structure in which a first feature is "on" a second feature may include implementations in which the first feature and second feature are formed in direct contact, and may include implementations in which additional features are formed between the first feature and second feature, in which case the first feature and second feature may not be in direct contact.

In addition, it should be noted that the use of terms such as "first" and "second" to define components is only for the convenience of distinguishing corresponding components, and if no other statement, the above words have no special meaning, therefore they should not be understood as limiting the claimed scope of the present disclosure.

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical" or "vertically" means nominally perpendicular to the lateral surface of a substrate.

As used herein, the term "substrate" refers to a material onto which subsequent material layers are added. The substrate itself can be patterned. Materials added on top of the substrate can be patterned or may remain unpatterned. Furthermore, the substrate may include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer may extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer may extend horizontally, vertically, and/or along a tapered surface. A substrate can be a layer, may include one or more layers therein, and/or may have one or more layer thereupon, there above, and/or there below. A layer may include a plurality of layers. For example, an interconnect layer may include one or more conductive and contact layers (in which contacts, interconnect lines, and/or VIAs are formed) and one or more dielectric layers.

Flow charts are used in the present disclosure to illustrate operations performed by systems according to implementations of the present disclosure. It should be understood that the preceding or following operations are not necessarily performed in an exact order. Instead, various steps can be processed in reverse order or concurrently. At the same time, other operations are either added to these processes, or a certain step or steps can be removed from these processes.

FIG. 1 illustrates a block diagram of an exemplary system 100 having a memory device according to some aspects of the present invention. The system 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other appropriate electronic devices having memory device therein. As shown in FIG. 1, system 100 may include a host 108 and a memory system 102, where the memory system 102 has one or more memory devices 104 and a memory controller 106; the host 108 can be a processor of an electronic device, e.g., a central processing unit (CPU) or a system on chip (SoC), where the system on chip can be, e.g., an application processor (AP). Host 108 can be configured to send data to or receive data from memory 104.

Specifically, memory 104 can be any memory disclosed in the present application, as disclosed in detail below, memory 104, e.g., a NAND flash memory (such as a three-dimensional (3D) NAND flash memory), which may have reduced leakage current from drive transistors coupled to unselected word lines during erase operation, and the magnitude of the drive transistors further shrinks.

According to some implementations, memory controller 106 is coupled to memory 104 and host 108, and is configured to control memory 104. Memory controller 106 may manage data stored in memory 104 and communicate with host 108. In some implementations, memory controller 106 is designed to operate in low duty cycle environments, e.g., Secure Digital (SD) card, Compact Flash (CF) card, Universal Serial Bus (USB) flash drive, or other media for use in electronic devices in low duty cycle environments such as personal computer, digital camera, mobile phone, etc. In some implementations, the memory controller 106 is designed to operate in high duty cycle environments, such as SSD or embedded multimedia card (eMMC), where SSDs or eMMCs are used as data storage and enterprise storage array for mobile devices in high duty cycle environments such as smartphone, tablet computer, laptop computer. Memory controller 106 can be configured to control operations of memory 104, e.g., read, erase and program operations. Memory controller 106 may also be configured to manage various functions related to data stored or to be stored in memory 104, including but not limited to bad block management, garbage collection, logical-to-physical address translation, wear leveling, etc. In some implementations, memory controller 106 is also configured to process error correction code (ECC) related to data read from or written to memory 104. Memory controller 106 may also perform any other appropriate functions, e.g., formatting memory 104. Memory controller 106 may communicate with external devices (e.g., host 108) according to a particular communication protocol. For example, the memory controller 106 can communicate with external devices through at least one of various interface protocols, e.g., USB protocol, MMC protocol, Peripheral Component Interconnect (PCI) protocol, PCI Express (PCI-E) protocol, advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 2A:
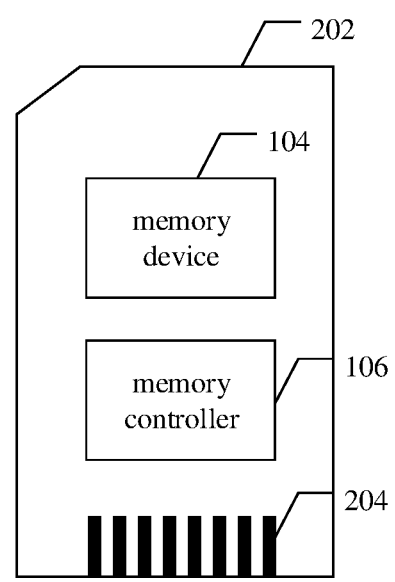
FIG. 2A is a schematic diagram of an exemplary memory card with a memory device according to some aspects of the present disclosure.
Figure 2B:
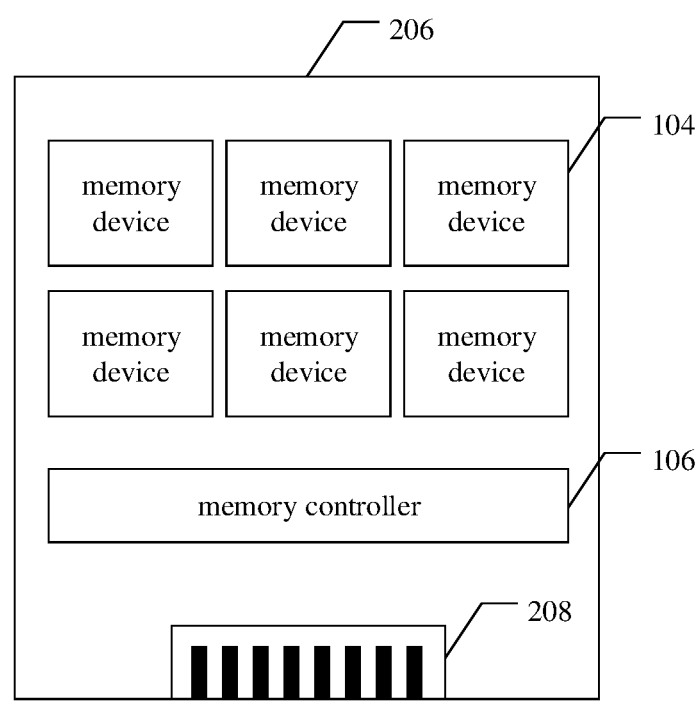
FIG. 2B is a schematic diagram of an exemplary solid state drive (SSD) with memory devices according to some aspects of the present disclosure.

Memory controller 106 and one or more memory devices 104 can be integrated into various types of memory devices, e.g., included in the same package (e.g., Universal Flash Storage (UFS) package or eMMC package). That is, memory system 102 can be implemented and packaged into different types of end electronic products. In one example as shown in FIG. 2A, memory controller 106 and a single memory device 104 can be integrated into a memory card 202. Memory card 202 may include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 may further include a memory card connector 24 coupling memory card 202 with a host (e.g., host 108 in FIG. 1). In another example as shown in FIG. 2B, memory controller 106 and a plurality of memory devices 104 can be integrated into a SSD 206. SSD 27 may further include an SSD connector 208 coupling SSD 206 with a host (e.g., host 108 in FIG. 1). In some implementations, the storage capacity and/or operating speed of SSD 206 is greater than the storage capacity and/or operating speed of memory card 202.

Figure 3:
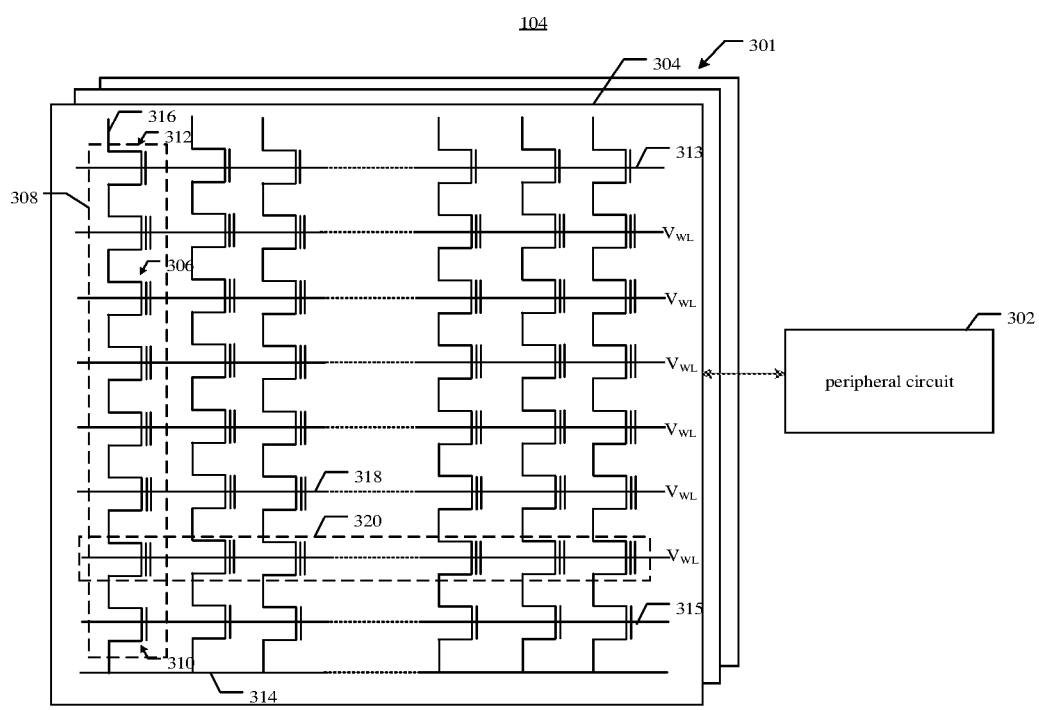
FIG. 3 is a schematic diagram of an exemplary memory device including peripheral circuit according to some aspects of the present disclosure.

FIG. 3 illustrates a schematic circuit diagram of an exemplary memory device 104 including peripheral circuit according to some aspects of the present disclosure. As shown in FIG. 3, memory device 104 may include a memory cell array 301 and peripheral circuit 302 coupled to the array of memory cell 301. Memory cell array 301 can be an array of NAND flash memory cells in which memory transistors 306 are provided in an array of NAND memory cell strings 308 each extending vertically over a substrate (not shown). In some implementations, each of NAND memory cell string 308 includes a plurality of memory transistors 306 coupled in series and stacked vertically. Each memory transistor 306 may retain a continuous analog value, e.g., voltage or charge, depending on the number of electrons trapped within the area of the memory transistor 306. Each memory transistor 306 can be a floating gate type memory transistor including a floating gate transistor, or a charge trap type memory transistor including a charge trap transistor.

Each memory transistor 306 discussed above (i.e., the memory cell described later) can be a single-level memory cell or a multi-level memory cell, wherein a single-level memory cell can be a single-level cell (SLC) capable of storing 1 bit (bit); a multi-level memory cell can be a multi-level cell (MLC) capable of storing 2 bits, a tertiary-level cell (TLC) capable of storing 3 bits, a quad-level cell (QLC) capable of storing 4 bits, and a penta-level cell (PLC) capable of storing 5 bits.

Referring back again to FIG. 3, each NAND memory cell string 308 may include a source select gate (SSG) 310 at its source terminal and a drain select gate (DSG) 312 at its drain terminal. SSG 310 and DSG 312 can be configured to activate selected NAND memory cell string 308 (columns of the array) during read operation and program operation. In some implementations, sources of NAND memory cell strings 308 in the same block 304 are coupled through the same source line (SL) 314 (e.g., a common SL). In other words, according to some implementations, all strings 308 of NAND memory cells in the same block 304 have an array common source (ACS). According to some implementations, DSG 312 of each NAND memory cell string 308 is coupled to a corresponding bit line 316 from or to which data can be read or written via an output bus (not shown). In some implementations, each NAND memory cell string 308 is configured to be selected or deselected through applying a select voltage (e.g., above the threshold voltage of a transistor with a DSG 312) or a deselect voltage (e.g., 0V) to the corresponding DSG 312 via one or more DSG lines 313 and/or applying a select voltage (e.g., above the threshold voltage of a transistor with a SSG 310) or a deselect voltage (e.g., 0V) to the corresponding SSG 310 via one or more SSG lines 315.

As also shown in FIG. 3, NAND memory cell string 308 can be organized into a plurality of blocks 304, each of which may have a common source line 314 (e.g., coupled to ground). In some implementations, each block 304 is the basic data unit for an erase operation, i.e., all memory transistors 306 on the same block 304 are erased simultaneously. To erase the memory transistor 306 in the selected block 304a, source line 314 coupled to selected block 304a and to unselected blocks 304b in the same plane as selected block 304a can be biased with an erase voltage (Vers) (e.g., a high positive voltage (e.g., 20V or higher)). It should be understood that, in some examples, erase operations can be performed at the half-block level, at the quarter-block level, or at a level with any appropriate number of blocks or any appropriate fraction of blocks. Memory transistors 306 of adjacent NAND memory cell strings 308 can be coupled through a word line 318 that selects which row of memory transistors 306 is affected by read and program operations. In some implementations, each word line 318 is coupled to a page 320 of memory transistors 306, page 320 can be the basic data unit for program operations. The magnitude of a page 320 in bits can be related to the number of NAND memory cell strings 308 coupled through word line 318 in a block 304. Each word line 318 may include a plurality of control gates (gate electrodes) at each memory transistor 306 in a corresponding page 320 and a gate line coupling the control gates.

Figure 4A:
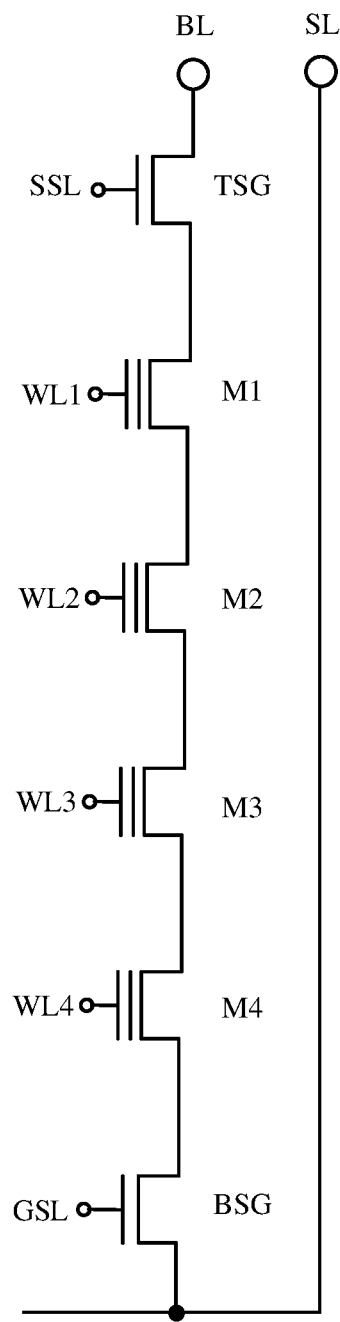
FIG. 4a is an exemplary circuit diagram of a memory cell string according to some aspects of the present disclosure.
Figure 4B:
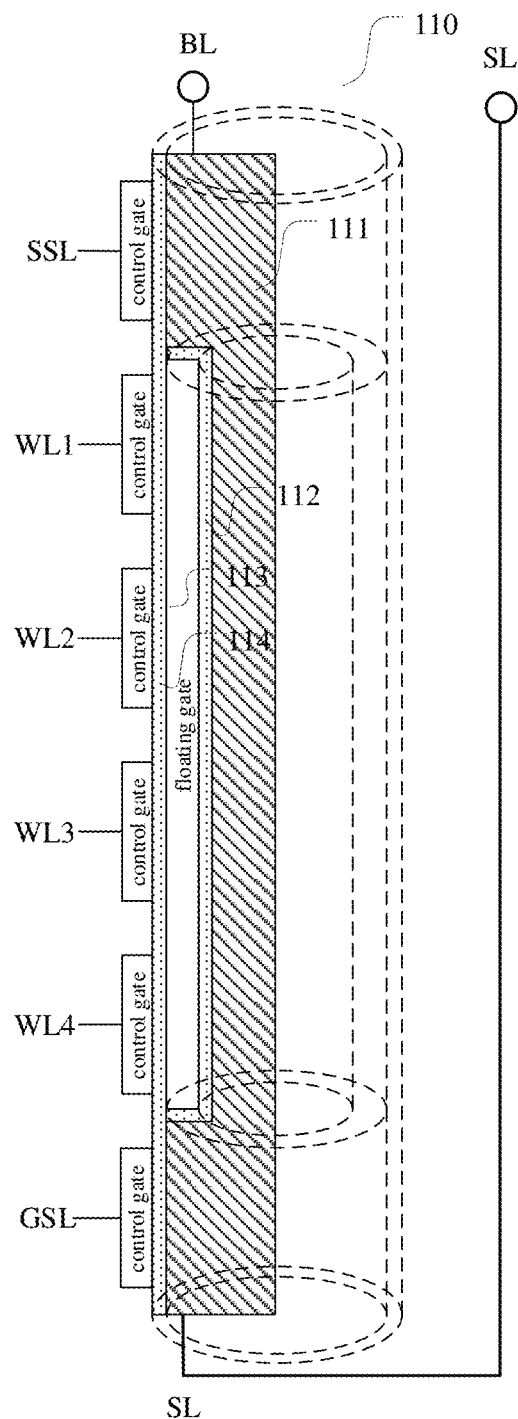
FIG. 4b is a schematic structure diagram of an exemplary memory cell string according to some aspects of the present disclosure.

FIGS. 4a and 4b respectively show an exemplary circuit diagram and an exemplary schematic structure diagram of the memory cell string 308. The case where a memory cell string includes 4 memory transistors is shown in this implementation. It can be understood that the present application is not limited thereto, and the number of memory transistors in the memory cell string can be any number, e.g., 32 or 64.

As shown in FIG. 4a, the first end of the memory cell string 308 is connected to the bit line BL, and the second end is connected to the source line SL. The memory cell string 308 includes a plurality of transistors connected in series between a first terminal and a second terminal, including a top select transistor TSG, memory transistors M1 to M4, and a bottom select transistor BSG. The top select transistor TSG is connected to the string selection line SSL through a drain select gate DSG included therein, and the bottom select transistor BSG is connected to the ground selection line GSL through a source select gate SSG included therein. Gate conductor of memory transistors M1-M4 are connected to corresponding word lines 318 of word lines WL1-WL4, respectively. In some implementations, the drain select gate DSG may also be referred to as a first control gate; the source select gate SSG may also be referred to as a second control gate.

As shown in FIG. 4b, the top select transistor TSG and the bottom select transistor BSG of the memory cell string 308 include gate conductors 122 and 123, respectively, and the memory transistors M1 to M4 include gate conductors 121, respectively. The gate conductors 121, 122, 123 are in the same stacking order as the transistors in the memory cell string 308, and adjacent gate conductors are separated from each other by an interlayer insulating layer, thereby a gate stacking structure is formed. Further, the memory cell string 308 includes a channel pillar 110. The channel pillar 110 runs through the gate stack structure. In the middle part of the channel pillar 110, the tunneling dielectric layer 112, the charge storage layer 113 and the blocking dielectric layer 114 are interposed between the gate conductor 121 and the channel region 111, thereby memory transistors M1 to M4 are formed. At both ends of the channel pillar 110, a blocking dielectric layer 114 is interposed between gate conductors 122 and 123 and channel region 111, thereby an top select transistor TSG and a bottom select transistor BSG are formed.

In this implementation, channel region 111 is composed of e.g., doped polysilicon; tunnel dielectric layer 112, charge storage layer 113 and blocking dielectric layer 114 are respectively composed of oxide, e.g., silicon oxide; and the charge storage layer 11 composed of insulating layer tungsten containing quantum dots or nanocrystals. Channel region 111 is used to provide the channel region of select transistor and memory transistor, and doping type of channel region 111 is the same as that of select transistor and memory transistor. For example, for N-type select transistors and memory transistors, the channel region 111 can be N-type doped polysilicon.

In this implementation, the core of the channel pillar 110 is the channel region 111, and the tunneling dielectric layer 112, the charge storage layer 113 and the blocking dielectric layer 114 form a laminated structure fixed around the sidewall of the core. In an alternative implementation, the core of the channel pillar 110 is an additional insulating layer, and the channel region 111, the tunneling dielectric layer 112, the charge storage layer 113 and the blocking dielectric layer 114 form a stacked structure surrounding the core.

In this implementation, top select transistor TSG and bottom select transistor BSG, and memory transistors M1 to M4 use a common channel region 111 and a blocking dielectric layer 114. In the channel pillar 110, the channel region 111 provides source and drain regions and channel regions of a plurality of transistors. In an alternative implementation, semiconductor layer and blocking dielectric layer of the top select transistor TSG and the bottom select transistor BSG, and semiconductor layer and blocking dielectric layer of memory transistors M1 to M4 can be formed respectively by steps separate from each other.

Figure 5:
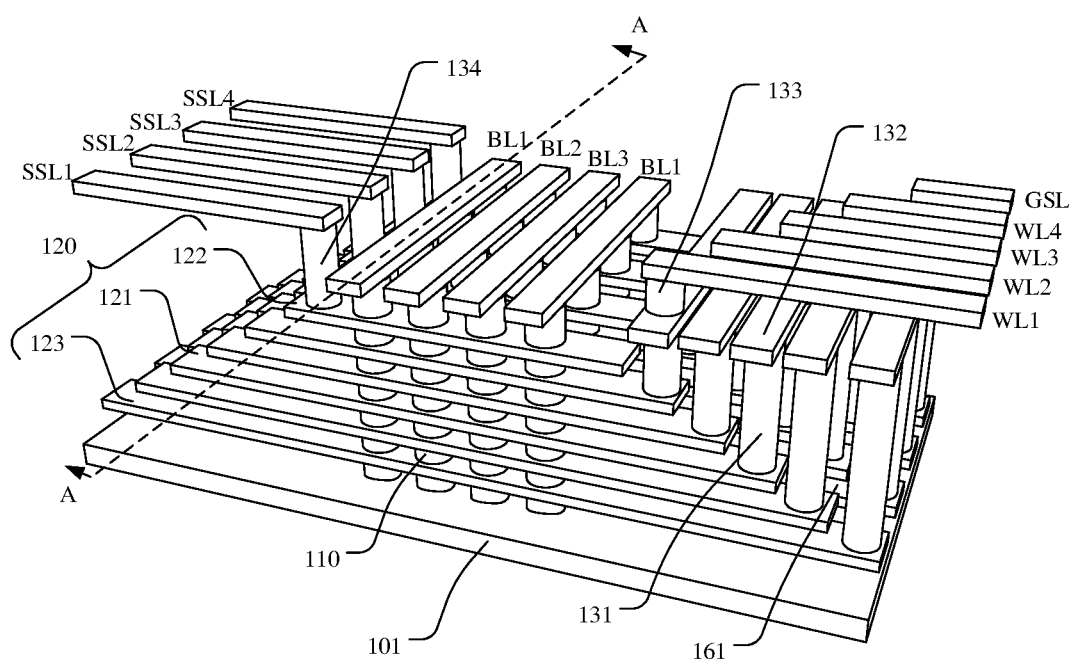
FIG. 5 is an exemplary perspective view of a 3D memory device according to some aspects of the present disclosure.

FIG. 5 illustrates a perspective view of a 3D memory device. The respective insulating layers in the 3D memory device are shown in FIG. 5.

The 3D memory device 500 shown in this implementation includes total of 4*4=16 memory cell strings 308, and each memory cell string 308 includes 4 memory transistors, thereby a memory array of 4*4*4=64 memory transistors in total are formed. It can be understood that the present invention is not limited thereto, and the 3D memory device 500 may include any number of memory cell strings, e.g., 1024, and the number of memory transistors in each memory cell string can be any number, e.g., 32 or 64.

In the 3D memory device 500, the memory cell strings include respective channel pillars 110 and common gate conductors 121, 122, 123. The gate conductors 121, 122, 123 are in the same stacking order with the transistors in the memory cell string 308, and adjacent gate conductors are separated from each other by an interlayer insulating layer, thereby a gate stacking structure 120 is formed. Interlayer insulating layer is not shown in the figure.

The internal structure of channel pillar 110 is shown in FIG. 4b, and will not be described in detail here. The channel pillars 110 run through the gate stacking structure 120 and are arranged in an array, first ends of the plurality of channel pillars 110 in the same column are commonly connected to the same bit line (i.e., one of the bit lines BL1 to BL4), second ends are commonly connected to substrate 101, and the second ends form a common source connection via the substrate 101.

The gate conductor 122 of the top select transistor TSG is divided into different gate lines by a gate line slit 102. The gate lines of the plurality of channel pillars 110 in the same row are commonly connected to a same string selection line (i.e., one of the string selection lines SSL1 to SSL4).

The gate conductors 121 of the memory transistors M1 to M4 are respectively connected to corresponding word lines 318. If gate conductors 121 of memory transistors M1 and M4 are divided into different gate lines by the gate line slit 161, gate lines on a same layer reach the interconnection layer 132 via respective conductive channels 131, thereby being interconnected with each other, and then connected to a same word line (i.e., one of the word lines WL1 to WL4) via conductive channel 133.

The gate conductors of the bottom select transistor BSG are integrally connected. If gate conductor 123 of the bottom select transistor BSG is divided into different gate lines by the gate line slit 161, the gate lines reach the interconnection layer 132 via the respective conductive channels 131, thereby being interconnected with each other, and then connected to the same ground selection line GSL via the conductive channel 133.

Figure 6:
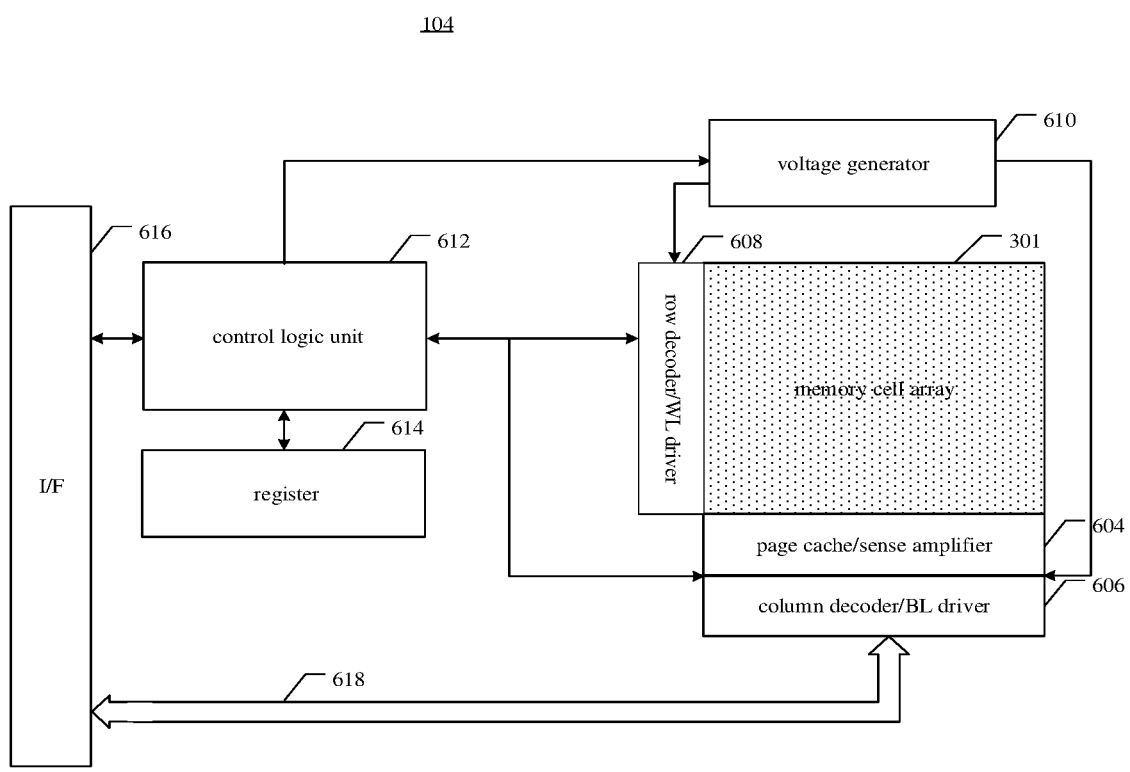
FIG. 6 is a block diagram of an exemplary memory device including a memory cell array and peripheral circuit according to some aspects of the present disclosure.

Referring back to FIG. 3, peripheral circuit 302 can be coupled to memory cell array 301 through bit line 316, word line 318, source line 314, SSG line 315, and DSG line 313. Peripheral circuit 302 may include any appropriate analog, digital, and mixed-signal circuit for facilitating operation of the array of memory cell 301 through applying voltage signal and/or a current signal to and sensing voltage signal and/or current signal from each target memory transistor 306 via bit line 316, word line 318, source line 314, SSG line 315, and DSG line 313. The peripheral circuit 302 may include various types of peripheral circuits formed with metal-oxide-semiconductor (MOS) technology. For example, FIG. 6 illustrates some exemplary peripheral circuits, peripheral circuit 302 includes page buffer/sense amplifier 604, column decoder/bit line driver 606, row decoder/word line driver 608, voltage generator 610, control logic unit 612, register 614, interface 616 and data bus 618. It should be understood that in some examples, additional peripheral circuits not shown in FIG. 6 may also be included.

The page buffer/sense amplifier 604 can be configured to read data from and program (write) data to the array of memory cell 301 according to control signals from the control logic unit 612. In one example, the page buffer/sense amplifier 604 may store a page of programming data (written data) to be programmed into one page 320 of the array of memory cell 301. In another example, page buffer/sense amplifier 604 may perform a programming verify operation to ensure that data has been correctly programmed into memory transistor 306 coupled to selected word line 318. In yet another example, page buffer/sense amplifier 604 may also sense a low power signal from bit line 316 representing a data bit stored in memory transistor 306 and amplify a small voltage swing to a recognizable logic level during a read operation. Column decoder/bit line driver 606 can be configured to be controlled by control logic unit 612 and to select one or more NAND memory cell strings 308 through applying a bit line voltage generated from voltage generator 610.

Row decoder/word line driver 608 can be configured to be controlled by control logic unit 612 and select/deselect block 304 of memory cell array 301 and select/deselect word line 318 of block 304. Row decoder/word line driver 608 may also be configured to drive word line 318 with a word line voltage generated from voltage generator 610. In some implementations, the row decoder/word line driver 608 may also select/deselect and drive the SSG line 315 and the DSG line 313. As described in detail below, the row decoder/word line driver 608 is configured to perform erase operations on the memory transistors 306 coupled to the selected word line 318. The voltage generator 610 can be configured to be controlled by the control logic unit 612, and generate word line voltage (e.g., read voltage, programming voltage, pass voltage, local voltage, verify voltage, etc.), bit line voltage and source line voltage to be supplied to the array of memory cell 301.

Control logic unit 612 can be coupled to each of the peripheral circuits described above and configured to control operations of each of the peripheral circuits. Register 614 can be coupled to the control logic unit 612 and include status register, command register and address register for storing status information, command operation code (OP code) and command address for controlling operations of each of the peripheral circuits. Interface 616 can be coupled to control logic unit 612 and function as a control cache to cache and relay control commands received from a host (not shown) to control logic unit 612 and to cache and relay status information received from the control logic unit 612 to the host. Interface 616 may also be coupled to column decoder/bit line driver 606 via data bus 618 and function as a data I/O interface and data cache to cache and relay data to/from memory cell array 301.

Figure 7:
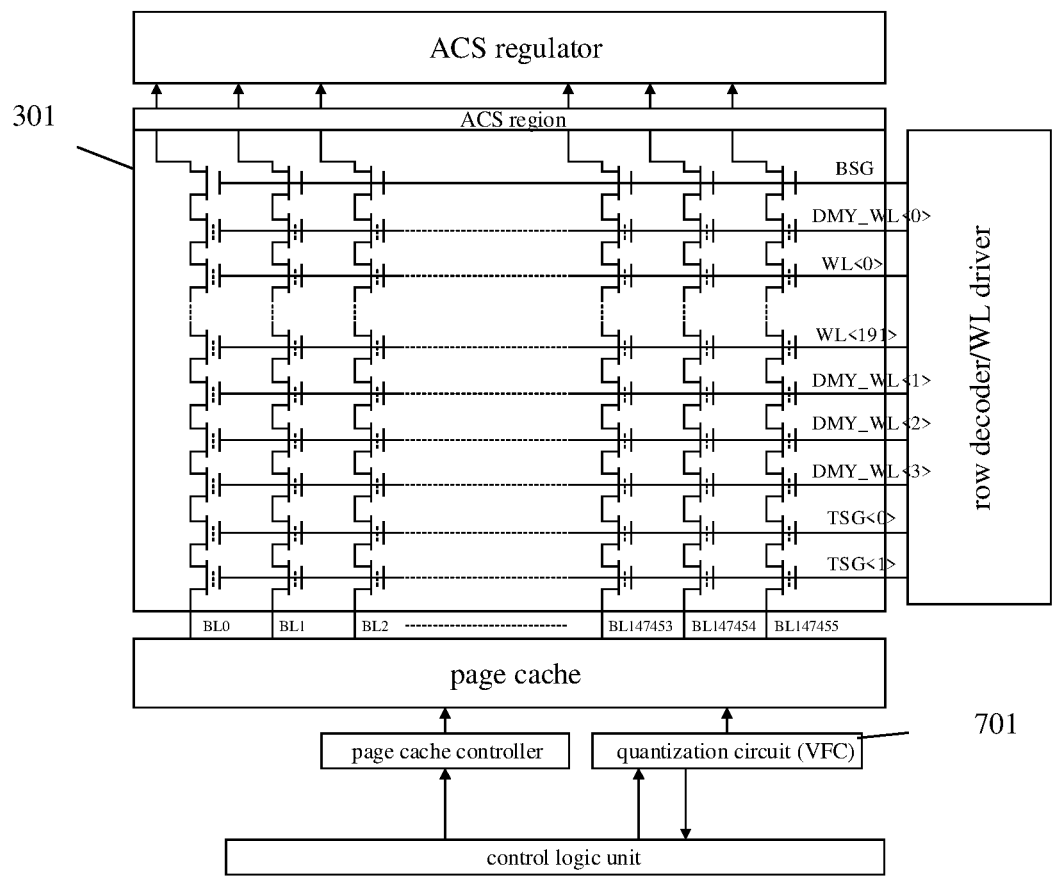
FIG. 7 is a schematic diagram of an exemplary memory device including verify failbit count circuit according to some aspects of the present disclosure.

It should be noted that, in some implementations, the peripheral circuit 302 further includes a verify failbit count circuit, which is used to perform write verification on memory cells to count the number of memory cells that fail to be written or have errors. In terms of structure, e.g., a schematic diagram of an exemplary memory including a verify failbit count circuit according to some aspects of the present disclosure in FIG. 7, the VFC circuit 701 (also referred as "count circuit" hereinafter) is connected to the control logic unit 612 and is controlled by the control logic unit 612, where the control logic unit controls the page buffer to set the logical position of the memory cell that has not passed by programming to 1, and set the logical position of the memory cell that has passed by programming to 0. In some implementations, the way for determining whether the memory cell has passed by programming can be: applying a read voltage to the word line coupled to the memory cell to read the magnitude of the induced current on the memory cell string where the memory cell is located, if the induced current is less than the specified target induced current value, it is determined that the memory cell has passed by programming; otherwise, if the induced current is not less than the specified target induced current value, it is determined that the memory cell has not passed by programming. Here, the count circuit 701 is connected to the page buffer in the page buffer/sense amplifier 604 for receiving the current output by the page buffer, and making statistics on the current to obtain the number of memory cells that have not passed by programming verification and output the number to the control logic unit, where if the memory cell passes by the program verification, the current signal is 0; if the memory cell fails by the program verification, page buffer of the bit line branch corresponding to the memory cell may output corresponding current signal. If the number counted by the VFC is greater than the set threshold, the control logic unit determines that programming is not finished, and continues to apply programming pulses to continue programming. The page buffer is connected to the memory array 301, connected to the control logic unit 612 through the page buffer controller, is used to receive a write or read instruction from the control logic unit 612 to write data into or read data from the memory array 301. In actual practice, the count circuit belongs to the Y-path circuit, where the Y-path circuit may refer to providing voltages to components in the Y direction (pointing to the bit line or source line) of the memory array 301 during different operations (such as read operation or write operation), e.g., providing a voltage to a bit line or a source line when the count circuit described herein is in operation.

Figure 8:
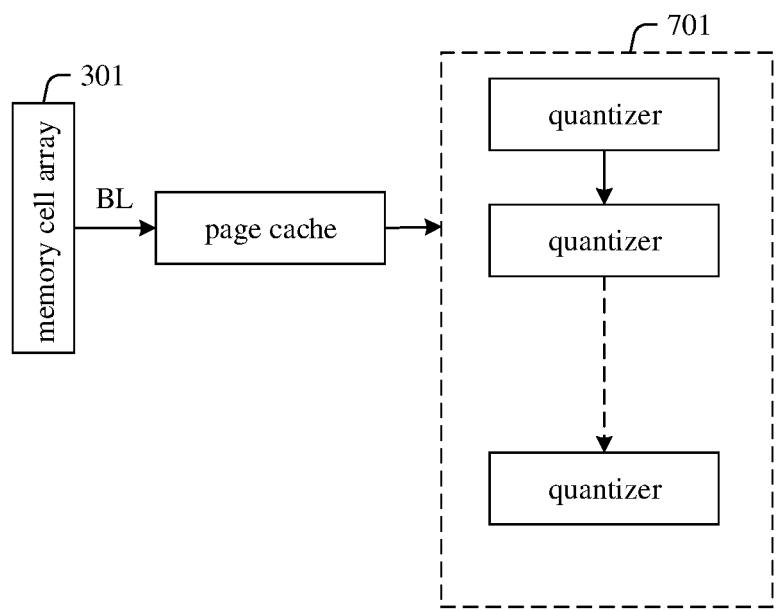
FIG. 8 is a schematic structure diagram of a VFC circuit according to the present disclosure.

The position and operating principle of the count circuit in the memory are described above, and the structure of the count circuit itself can be shown in FIG. 8, which is a schematic structure diagram of a VFC circuit. Referring to FIG. 8, the array of memory cell 301 is connected to a page buffer through a bit line (BL), and the page buffer is connected to a VFC circuit 701. The array of memory cell 301 includes a plurality of memory cells (Cells). After the program operation, the page buffer outputs a current signal or a voltage signal to the VFC circuit 701. If the memory cell has passed the programming verification, the current signal is 0, and the page buffer of the bit line branch corresponding to the memory cell will output a corresponding voltage signal; if the memory cell has not passed the programming verification, the bit line branch corresponding to the memory cell will output a corresponding current signal, and the voltage signal is 0. By counting the current signal or voltage signal, the VFC circuit 701 may obtain the number of memory cells that have not passed by the programming verification and output the number. Referring to FIG. 8, the VFC circuit 701 generally includes a plurality of counters.

Figure 9A:
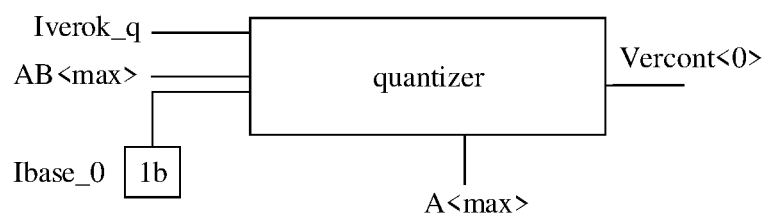
FIGS. 9A-9D are examples of counters in a VFC circuit.
Figure 9B:
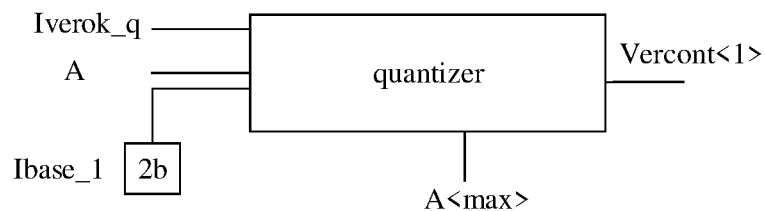
Figure 9C:
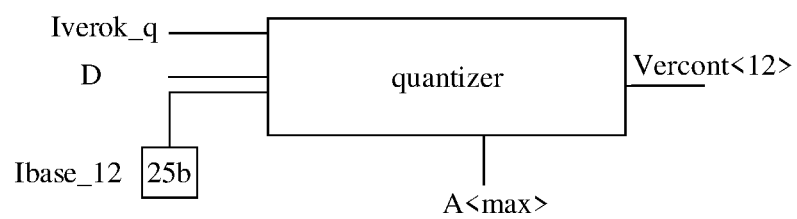
Figure 9D:
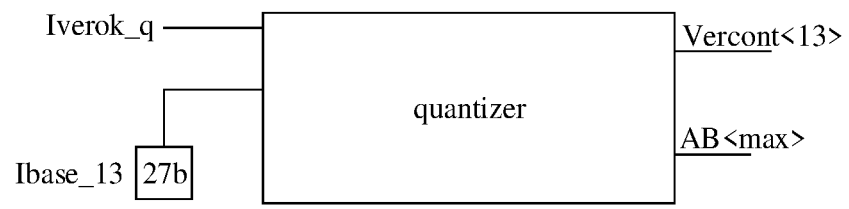

FIGS. 9A-9D are examples of counters in a VFC circuit. In this example, the VFC circuit includes a total of 14 counters, and the verify failbit current Iverok_q from the page buffer can be compared with base currents of different magnitudes to obtain the comparison result Vercont<0:13>, and the specific number of verify failbits can be output according to the comparison result. FIGS. 9A-9D illustrate 4 of the 14 counters. Wherein FIG. 9A illustrates a counter with a base current Ibase_0 of 1b, where 1b represents 1 unit of current or 1 time of a standard current. When the verify failbit current Iverok_q is greater than the base current Ibase_0, Vercont<0>=1 is output, otherwise Vercont<0>=0. FIG. 9B illustrates a counter with a base current Ibase_1 of 2b, where 2b represents 2 units of current or 2 times of the standard current. When the verify failbit current Iverok_q is greater than the base current Ibase_2, Vercont<1>=1 is output, otherwise Vercont<1>=0. FIG. 9C illustrates a counter with a base current Ibase_12 of 25b, where 25b represents 25 units of current or 25 times of the standard current. When the verify failbit current Iverok_q is greater than the base current Ibase_12, Vercont<12>=1 is output, otherwise Vercont<12>=0. FIG. 9D illustrates a counter with a base current Ibase_13 of 27b, where 27b represents 27 units of current or 27 times of the standard current. When the verify failbit current Iverok_q is greater than the base current Ibase_13, Vercont<13>=1 is output, otherwise Vercont<13>=0.

In the examples shown in FIGS. 9A-9D, the verify standard of the VFC circuit is 27b, i.e., the maximum units of current that the VFC circuit may operate is 27 times of the standard current, and only one maximum current level can be set, at this point, the example of the counter in the VFC circuit shown in FIG. 9D can be used as an example of a highest bit counter in the VFC circuit. During the operation of the VFC circuit, regardless of whether the verify failbit current Iverok_q reaches 27 times of the standard current, each counter is in working condition, and if the verify failbit current Iverok_q does not reach 27 times of the standard current during the whole verification process, the counter with a larger base current actually consumes excessive power consumption.

It should be noted that, in FIGS. 9A-9D, the left side of the counter represents an input terminal, and the rear part represents an output terminal. In FIGS. 9A-9C, A<max> is in phase with the output Vercont<13> of a highest bit counter. That is, Vercont<13>=1 while A<max>=1, and Vercont<13>=0 while A<max>=0. AB<max> is an inverse signal of A<max>. Inputs A and D represent enable signals, which can be active at a high level. That is, when the input A or D level is at the high level, the corresponding counter is enabled to work; otherwise, when the input A or D level is at a low level, the corresponding counter is disabled to work.

FIGS. 9A-9D are only examples, and the number of counters in the VFC circuit can be set as required. When the number of counters is large, the counters can be grouped, and the counters in each group work simultaneously, and different groups can work at the different time periods, which may reduce excessive power consumption to a certain extent, but will reduce running speed and prolong processing time.

Figure 10:
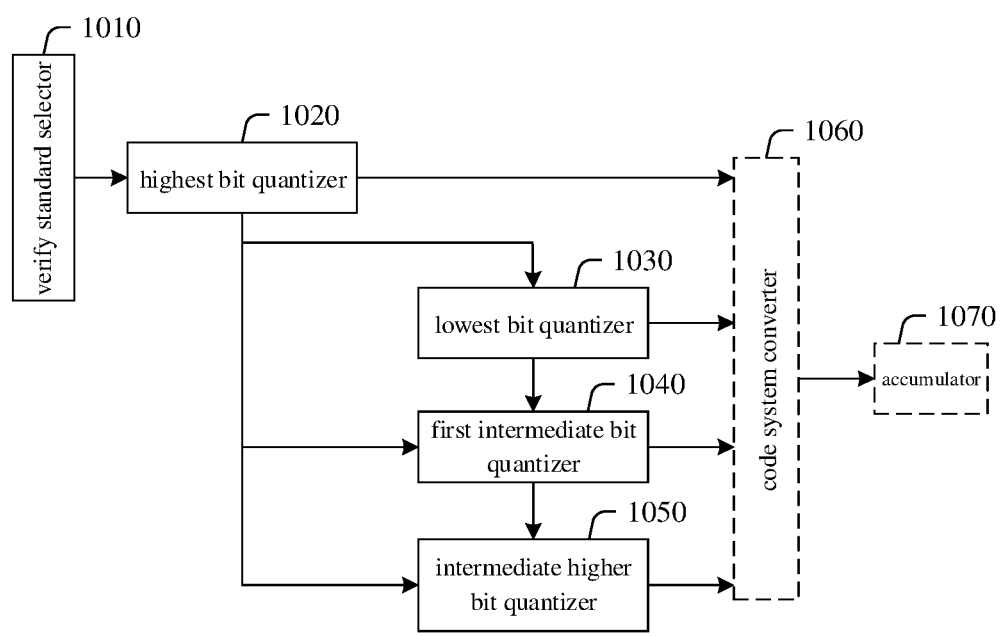
FIG. 10 is a block diagram of a verify failbit count circuit according to an implementation of the present disclosure.

FIG. 10 is a block diagram of a verify failbit count circuit according to an implementation of the present disclosure. Referring to FIG. 10, a verify failbit count circuit 200 of a semiconductor memory according to an implementation of the present disclosure includes a highest bit counter 1020, a lowest bit counter 1030 and at least one intermediate bit counter.

The highest bit counter 1020 is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit.

The lowest bit counter 1030 is connected to the highest bit counter 1020, and is configured to: receive the first enable signal, the verify failbit signal and the first reference signal; compare the verify failbit signal with the first reference signal to generate a second comparison result based on the first enable signal being enabled; output a second enable signal according to the second comparison result.

A first intermediate bit counter 1040 of the at least one intermediate bit counter is connected to the lowest bit counter 1030 and is configured to: receive the second enable signal, the verify failbit signal and a second reference signal; compare the verify failbit signal with the second reference signal to generate a third comparison result based on the second enable signal being enabled.

The first reference signal is the lowest bit standard signal that can be processed by the count circuit, and is less than the verify standard signal; the second reference signal is greater than the first reference signal, but less than the verify standard signal.

It should be noted that the highest bit counter 1020, the lowest bit counter 1030, and the first intermediate bit counter 1040 of at least one intermediate bit counter are connected in sequence, wherein, the highest bit counter 1020 is configured to: receive a verify standard signal and a verify failbit signal; compare the verify standard signal with the verify failbit signal to generate a result of the first comparison; output a first enable signal according to the result of the first comparison, the first enable signal is used to control the lowest bit counter 1030 to be turned on or turned off; The lowest bit counter 1030 is connected to the highest bit counter and is configured to: compare the verify failbit signal with the first reference signal to generate a second comparison result when the lowest bit counter 1030 is controlled to be turned on; output a second enable signal according to the second comparison result, the second enable signal is used to control to turn on or turn off the first intermediate bit count circuit 1040 of at least one intermediate bit counter; and, the first intermediate bit counter 1040 is configured to: compare the verify failbit signal with the second reference signal to generate a third comparison result when the first intermediate bit counter 1040 is controlled to turned on, wherein the second reference signal is greater than the first reference signal, and the second reference signal is less than the verify standard signal.

In some implementations, as shown in FIG. 10, the count circuit 200 further includes a verify standard selector 1010 configured to: select one from at least two verify standard with different magnitudes as the verify standard signal for the highest bit.

As an optional implementation, the verify standard selector 1010 includes at least one inverter configured to: select, according to an input signal itself, one from at least two verify standard with different magnitudes as the verify standard signal for the highest bit.

Figure 11A:
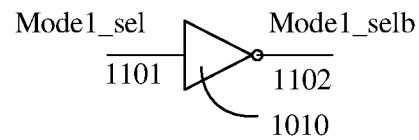
FIG. 11A is a schematic structure diagram of a verify standard selector in a verify failbit count circuit according to an implementation of the present disclosure.

FIG. 11A is a schematic structure diagram of a verify standard selector 1010 in a verify failbit count circuit according to an implementation of the present disclosure. Referring to FIG. 11A, the verify standard selector 1010 includes an inverter, its input terminal 1101 controls the selection of one verify standard Model_sel, and its output terminal 1102 controls the selection of another verify standard Model_selb. Obviously, Model_sel and Model_selb are mutually inverse. If Model_sel is 1, Model_selb is 0; if Model_sel is 0, Model_selb is 1. Through control of the input signal of the inverter, one of Model_sel and Model_selb can be 0, and the other can be 1. In some implementations, it can be implemented that the input terminal and the output terminal of the inverter are at a high level, and the verify standard corresponding to this terminal is selected as the verification base of the highest bit counter in FIG. 10, that is, when Model_sel is 1, the verify standard controlled by the input terminal is selected as the verification base of the highest counter in FIG. 10; when Model_selb is 1, the verify standard controlled by the output terminal is selected as the verification base of the highest counter in FIG. 10.

FIG. 11A illustrates an implementation in which one verify standard is selected from two verify standard with different magnitudes as the verify standard signal. For an implementation with more than two verify standards, a corresponding verify standard selector 1010 can be designed to implement the function of selecting one verify standard from more than two verify standards.

In some implementations, the highest bit counter 1020 includes a first comparator and a first inverter; wherein, the first comparator is configured to: receive the verify standard signal and the verify failbit signal; compare the verify standard signal with the verify failbit signal to generate a result of the first comparison; output the result of the first comparison; the first inverter is connected to the first comparator and is configured to: receive the result of the first comparison, and output the first enable signal according to the result of the first comparison; the first enable signal is an inverse signal of the result of the first comparison.

Figure 11B:
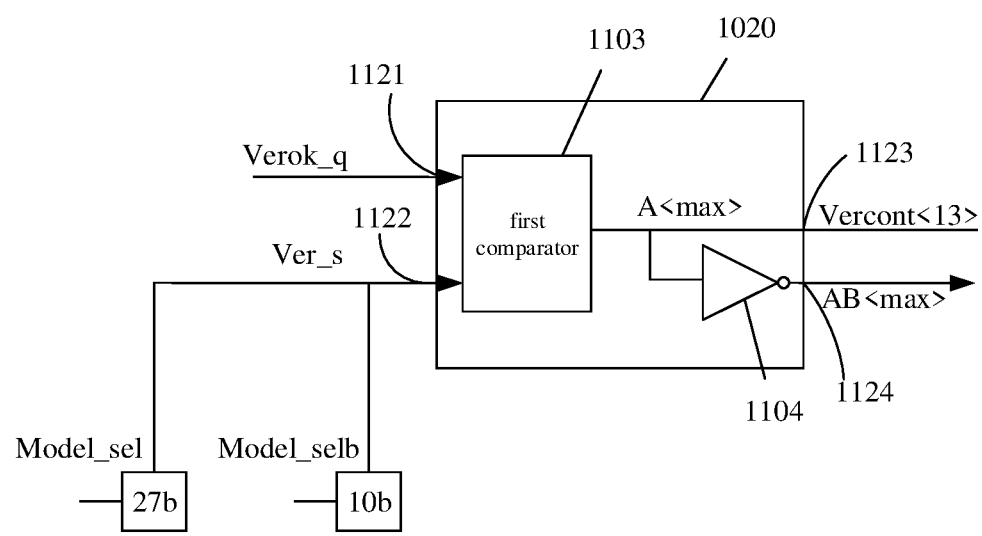
FIG. 11B is a schematic structure diagram of a highest bit counter in a verify failbit count circuit according to an implementation of the present disclosure.

FIG. 11B is a schematic structure diagram of a highest bit counter in a verify failbit count circuit according to an implementation of the present disclosure. As shown in FIG. 11B, the highest bit counter 1020 includes a first comparator 1103 and a first inverter 1104, wherein the first comparator includes two input terminals 1121, 1122 and two output terminals 1123, 1124. Wherein, the input terminal 1121 can be connected to the verify failbit signal Verok_q, and the input terminal 1122 can be connected to the verify standard signal Ver_s. The highest bit counter 1020 is applicable to comparing the verify failbit signal Verok_q with the verify standard signal Ver_s, and outputting a result of the first comparison Vercont<13> from the output terminal 1105.

The implementation of the present disclosure does not limit the verify failbit signal Verok_q and the verify standard signal Ver_s to be current signals or voltage signals, it can be understood that the verify failbit signal Verok_q and the verify standard signal Ver_s can be signals of the same type, e.g., both are voltage signals or both are current signals. In a preferred implementation, the verify failbit signal Verok_q is a current signal from a page buffer, and the verify standard signal Ver_s is a current signal corresponding to a certain verify standard. The verify standard is a verify standard for the verify failbit count circuit, and is used to limit the maximum current of the verify failbit current that can be quantified by the verify failbit count circuit. Unless specified otherwise below, the verify failbit signal Verok_q and the verify standard signal Ver_s refer to current signal.

Referring to FIG. 11B, the input 1122 is connected to two verify standard, e.g., 27b, 10b. One of these two verify standard is controlled by the Model_sel signal, and the other is controlled by the Model_selb signal, where Model_sel corresponds to 27b, i.e., 27 times of the standard current, and Model_selb corresponds to 10b, i.e., 10 times of the standard current. That is to say, the verify standard controlled by Model_sel is larger, and the verify standard controlled by Model_selb is smaller. At the same time, according to the verify standard selector shown in FIG. 11A, only one of the verify standards corresponding to Model_sel and Model_selb will be selected as the verify standard signal Ver_s input from the input terminal 1122 to the highest bit counter 1020.

According to the implementations described above, an appropriate verify standard signal Ver_s can be selected for the verify failbit count circuit from a plurality of verify standard. Compared with the VFC circuit with only one verify standard, the verify failbit count circuit of the disclosed implementations may flexibly switch verify standard signals.

Referring to FIG. 11B, the result of the first comparison Vercont<13> output by the highest bit counter 1020 is equivalent to the highest bit quantization result. For ease of illustration, the number 13 in FIG. 11B corresponds to the example shown in FIGS. 9A-9D, i.e., the verify failbit count circuit includes a total of 14 counters. However, the number 13 is only an example, and is not used to limit the number of counters in the verify failbit count circuit of the present disclosure, and the specific number of counters can be set as required. According to the implementation shown in FIG. 11B, the highest bit counter 1020 corresponds to the counter with the greatest reference signal in the verify failbit count circuit, and the result of the first comparison Vercont<13> output by this counter is the 14th bit of the final output result, i.e., the highest bit.

Referring to FIG. 11B, the first inverter 1104 in the highest bit counter 1020 outputs a first enable signal AB<max> according to the result of the first comparison Vercont<13>. In this implementation, the first enable signal AB<max> is the inverse signal of the result of the first comparison Vercont<13>, and the output signal A<max> of the highest bit counter 1020 indicated in FIG. 11B is equal to the result of the first comparison Vercont<13>.

It should be noted that the first comparator and the first inverter described here are only used to distinguish them from components in the lowest bit counter and intermediate bit counter described later, and not to limit the present disclosure.

After introducing the structure of the highest bit counter, the lowest bit counter will be described in detail below. Since the lowest bit counter is controlled by the highest bit counter, its structure is more complicated.

In some implementations, the lowest bit counter includes a second comparator and a first control circuit, wherein: the first control circuit is connected to the first inverter, and is configured to: receive the first enable signal; control the lowest bit counter to be turned on or turned off based on the first enable signal; the second comparator is configured to: receive the verify failbit signal and the first reference signal when the first control circuit controls the lowest bit counter to be turned on based on the first enable signal; compare the verify failbit signal with the first reference signal to generate a second comparison result.

Figure 12:
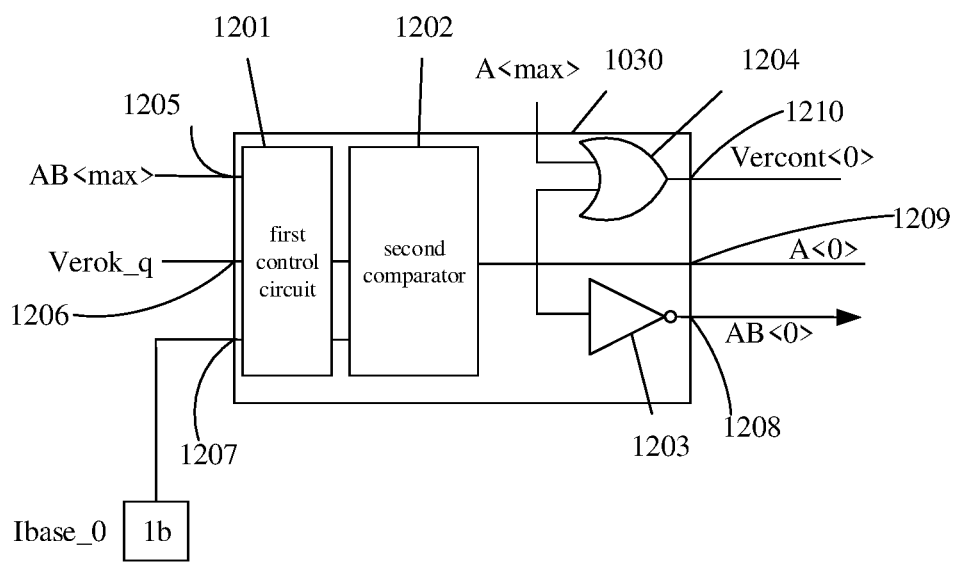
FIG. 12 is a schematic structure diagram of a lowest bit counter in a verify failbit count circuit according to an implementation of the present disclosure.

As shown in FIG. 12, the FIG. 12 is a block diagram of a lowest bit counter in a verify failbit count circuit according to an implementation of the present disclosure. As shown in FIG. 12, the lowest bit counter 1030 may include a first control circuit 1201, a second comparator 1202, a second inverter 1203 and a first OR gate 1204, and may also include three input terminals 1205-1207 and three output terminals 1208-1210, wherein a verify failbit signal Verok_q is connected to the input terminal 1206; a first enable signal AB<max> output by highest bit counter 1020 is connected to the input terminal 1205, the first enable signal AB<max> is used to control the lowest bit counter 1030 to be turned on or turned off; a first reference signal Ibase_0 is connected to input terminal 1207. When the lowest bit counter 1030 is turned on, the lowest bit counter 1030 compares the verify failbit signal Verok_q with the first reference signal Ibase_0 to generate a second comparison result Vercont<0>. In the implementation shown in FIG. 12, the first reference signal Ibase_0 corresponds to 1b, i.e., 1 standard current. Therefore, the lowest bit counter 1030 corresponds to the counter with the least reference signal in the verify failbit count circuit, and the second comparison result Vercont<0> output by this counter is the 0th bit of the final output result, i.e., the lowest bit.

As shown in FIG. 11B and FIG. 12, when the verify failbit signal Verok_q is less than the verify standard signal Ver_s, the result of the first comparison Vercont<13> output by the highest bit counter 1020 is 0, the first enable signal AB<max> is 1. According to the first enable signal AB<max>, the lowest bit counter 1030 is turned on, and the lowest bit counter 1030 compares the verify failbit signal Verok_q with the first reference signal Ibase_0. In some implementations, when the verify failbit signal Verok_q is greater than the first reference signal Ibase_0, the second comparison result Vercont<0> is 1, otherwise, the second comparison result Vercont<0> is 0. The lowest bit counter 1030 outputs a second enable signal A<0> after the comparison is finished, and the second enable signal A<0> is used to control the first intermediate bit counter described later to be turned on or turned off.

Referring to FIG. 11B and FIG. 12, when the verify failbit signal Verok_q is greater than the verify standard signal Ver_s, the result of the first comparison Vercont<13> output by the highest bit counter 1020 is 1, and the first enable signal AB<max> is 0, the lowest bit counter 1030 is turned off In this case, it means that the verify failbit signal Verok_q is greater than the verify standard signal Ver_s, thus the failbit count is the maximum value, while a verification failure signal (the value is excessively great) is output.

According to the implementation described above, when the verify failbit signal Verok_q is greater than the verify standard signal Ver_s, the lowest bit counter 1030 does not have to be turned on, thereby saving extra power consumption of the lowest bit counter 1030.

In some implementations, the second comparator is further configured to: output a second enable signal according to the second comparison result; wherein the second enable signal is in phase with the second comparison result.

Here, the fact that the second enable signal is in phase with the second comparison result can be understood as: when the second comparison result is 1, the second enable signal is also 1, and the first intermediate bit counter described later is turned on; when the second comparison result is 0, the second enable signal is also 0, and the first intermediate bit counter described later is turned off In a preferred implementation manner, the second enable signal is also the second comparison result.

In some implementations, the first control circuit includes at least a P-type transistor T1, a P-type transistor T2, and an N-type transistor T3; the drain of the P-type transistor T1 is connected to the source of the P-type transistor T2, and the drain of the P-type transistor T2 is connected to the drain of the N-type transistor T3; the base of the P-type transistor T1 is connected to the output terminal of the first inverter; the base and drain of the P-type transistor T2 are connected to the verify failbit signal; the base of the N-type transistor T3 is connected to the first reference signal; wherein the P-type transistor T1 is turned on or turned off based on the first enable signal to control the lowest bit counter to be turned on or turned off.

Figure 13:
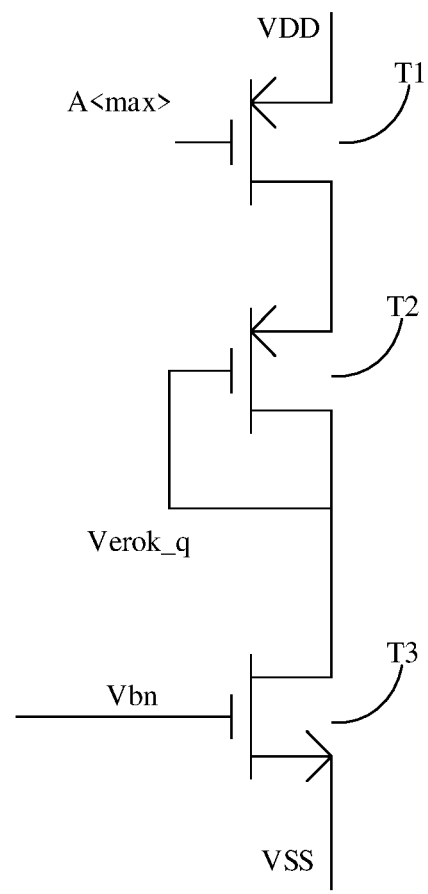
FIG. 13 is a schematic structure diagram of an enable signal control circuit in a verify failbit count circuit according to an implementation of the present disclosure.

FIG. 13 is a schematic structure diagram of an enable signal control circuit in a verify failbit count circuit according to an implementation of the present disclosure. The enable signal control circuit is a part of the count circuit, and can be used as a part of the highest bit counter 1020, the lowest bit counter 1030, and at least one intermediate bit counter 1003. Referring to FIG. 13, taking the fourth enable signal A<max> as an example, the enable signal control circuit includes at least three transistors T1, T2 and T3, wherein the transistor T1 is a P-type transistor, e.g., a P-type Metal Oxide Semiconductor Field Effect Transistor (MOSFET); and the transistor T2 is also a P-type transistor. For example, a P-type MOSFET; the transistor T3 is an N-type transistor, e.g., an N-type MOSFET. The connection relationship can be: the fourth enable signal A<max> is connected to the base of the P-type transistor T1, the verify failbit signal Verok_q is connected to the base and drain of the P-type transistor T2, and the drain of the P-type transistor T2 is connected to the drain of the N-type transistor T3, and the base of the N-type transistor T3 is connected to the first reference signal. Its working principle is as follows: when the first enable signal A<max> is 0, the transistor T1 is turned off, thereby the enable signal control circuit is turned off, and the failbit signal Verok_q is not presented, and the count circuit is turned off, thus the counter does not work, e.g., the lowest bit counter is turned off; when the first enable signal A<max> is 1, the transistor T1 is turned on, thereby the enable signal control circuit is turned on, e.g., the lowest bit counter is turned on. When different verify standard signals Ver_s are selected, the magnitudes of the verify failbit signals Verok_q corresponding to the fourth enable signal AB<max> are different, so that the count circuits under different verify standard can be controlled to be turned on and turned off.

It can be understood that what is shown in FIG. 13 is only an example. According to the idea of the present disclosure, the counter can be controlled to be turned on or turned off according to the enable signal through employing the technology in the art, and is not limited to the circuit structure described above.

In some implementations, the first control circuit further includes an N-type transistor T4 and a first NAND gate; wherein, the drain of the N-type transistor T4 is connected to the source of the N-type transistor T3, the base of the N-type transistor T4 is connected to the output terminal of the first NAND gate, and is configured to be turned off when the first NAND gate outputs a low level to turn off the lowest bit counter.

In some implementations, the first NAND gate has two input terminals, one input terminal is connected to the system voltage VDD, and the other input terminal is connected to the second enable signal.

In some implementations, the lowest bit counter 1030 further includes a first OR gate 1204, the two input terminals of the first OR gate are respectively connected to the fourth enable signal and the second enable signal, and the output of the first OR gate is used as the second comparison result output by the lowest bit counter. That is, the output terminal 1204 outputs the second enable signal A<0>, and when the fourth enable signal A<max>=1, the second comparison result Vercont<0> is equal to the second enable signal A<0>.

The structure and working principle of the lower intermediate counter will be introduced in detail below.

In some implementations, the at least one intermediate bit counter is connected sequentially according to the reference signal from low to high, wherein the reference signal of the i-th intermediate bit counter is less than the base of the (i+1)-th intermediate bit counter; the turning on or turning off of the i-th intermediate bit counter is controlled by the i−1 intermediate bit counter; wherein the (i−1)-th intermediate bit counter is an intermediate counter or the lowest bit counter; i is an integer greater than or equal to 1.

In some implementations, the at least one intermediate bit counter includes the first intermediate bit counter and an intermediate higher bit counter arranged adjacent to the first intermediate bit counter; the first intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; the intermediate higher bit counter is connected to the first intermediate bit counter, and is configured to: receive a third enable signal output by the first intermediate bit counter according to the third comparison result, and receive the verify failbit signal and the third reference signal; compare the verify failbit signal with a third reference signal to generate a fourth comparison result based on the third enable signal being turned on; wherein the third reference signal is greater than the second reference signal and less than or equal to the verify standard signal.

Figure 14:
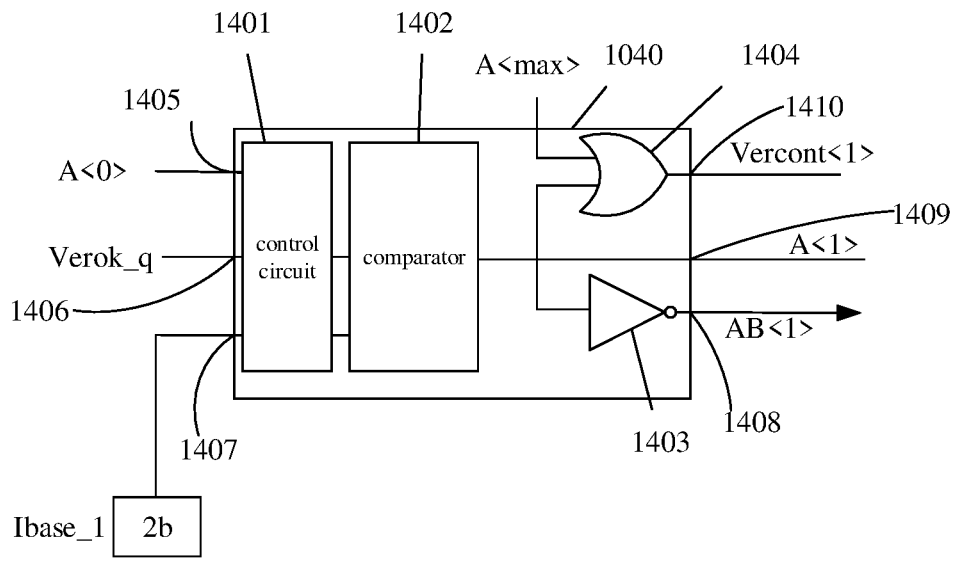
FIG. 14 is a schematic structure diagram of an intermediate bit counter in a verify failbit count circuit according to an implementation of the present disclosure.

As shown in FIG. 14, the FIG. 14 is a schematic structure diagram of a first intermediate bit counter in a verify failbit count circuit according to an implementation of the present disclosure. Referring to FIG. 14, the first intermediate bit counter includes three input terminals 1405-1407 and three output terminals 1408-1410. Wherein the verify failbit signal Verok_q is connected to the input terminal 1406; the second enable signal A<0> output by the lowest bit counter 1030 according to the second comparison result Vercont<0> is connected to the input terminal 1405, the second enable signal A<0> is used to control the first intermediate bit counter to be turned on or turned off; the second reference signal Ibase_1 is connected to the input terminal 1407. When the first intermediate bit counter is turned on, the first intermediate bit counter compares the verify failbit signal Verok_q with the second reference signal Ibase_1 to generate a third comparison result Vercont<1>. In the implementation shown in FIG. 14, the output terminal 1409 outputs the third enable signal A<1>, the output terminal 1410 outputs Vercont<1>, and the output terminal 1408 outputs the inverse signal AB<1> of A<1>. Wherein, when the fourth enable signal A<max>=1, the third comparison result Vercont<1> is equal to the third enable signal A<1>.

In the implementation shown in FIG. 14, the second reference signal Ibase_1 corresponds to 2b, i.e., 2 times of the standard current. In some implementations, the first intermediate bit counter corresponds to a counter in a verify failbit count circuit with a reference signal being at an intermediate level, and the third comparison result Vercont<1> output by this counter is the first bit of the final output result, which is adjacent to the 0-th bit and the second bit.

FIG. 14 is not used to limit the specific magnitude of the second reference signal Ibase_1. According to requirements, the second reference signal Ibase_1 can be set to be any value greater than the first reference signal Ibase_0 and less than the verify standard signal Ver_s.

As shown in FIGS. 12-14, when the verify failbit signal Verok_q is greater than the first reference signal Ibase_0, the lowest bit counter 1030 outputs the second comparison result Vercont<0> of 1, and also outputs the second enable signal A<0> of 1 according to the second comparison result Vercont<0>, thereby causing the first intermediate bit counter to be turned on. The first intermediate bit counter compares the verify failbit signal Verok_q with the second reference signal Ibase_1. In some implementations, when the verify failbit signal Verok_q is greater than the second reference signal Ibase_1, the third comparison result Vercont<1> is 1, otherwise, the third comparison result Vercont<1> is 0.

In these implementations, the second reference signal Ibase_1 is greater than the first reference signal Ibase_0, and the second reference signal Ibase_1 is less than or equal to the verify standard signal Ver_s.

As shown in FIG. 11B, when the verify standard signal Ver_s corresponds to 10 times of the standard current, the magnitude of the second reference signal Ibase_1 in the first intermediate bit counter is equal to the verify standard signal Ver_s. The verify failbit count circuit may only include a highest bit counter 1020, a lowest bit counter 1030 and a first intermediate bit counter 1040. In these implementations, the one lowest bit counter 1030, one first intermediate bit counter 1040 and one highest bit counter 1020 are structurally adjacent and connected sequentially.

In some implementations, a verify failbit count circuit of the present disclosure may include a plurality of first intermediate bit counters 1040. For example, a verify failbit count circuit may include a highest bit counter 1020, a lowest bit counter 1030 and a plurality of first intermediate bit counters 1040 connected in sequence, and magnitudes of reference signals of these first intermediate bit counters 1040 are between the first reference signal Ibase_0 and the verify standard signals Ver_s, and each of reference signals is different, gradually increasing from low to high.

Figure 15:
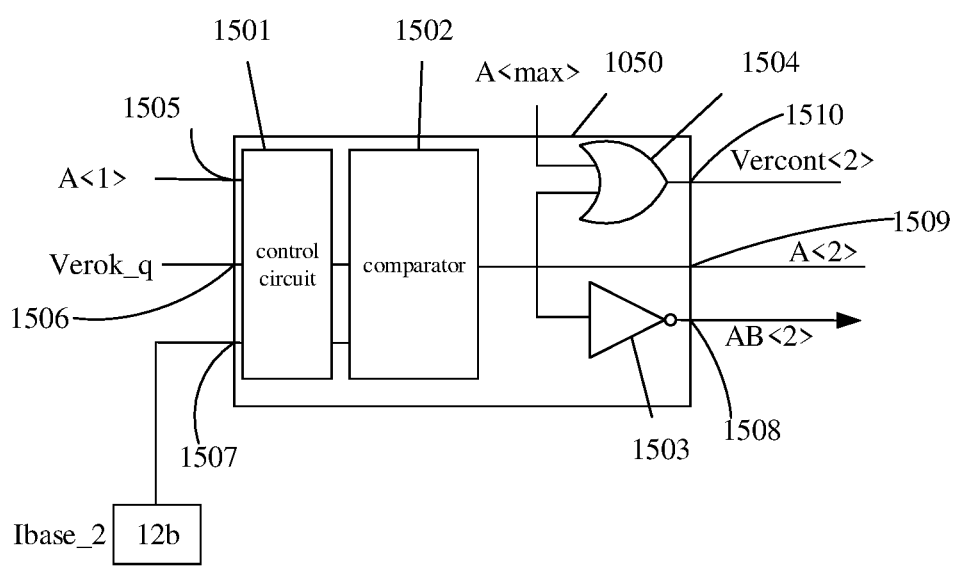
FIG. 15 is a schematic structure diagram of an intermediate higher bit counter in a verify failbit count circuit according to an implementation of the present disclosure.

In some implementations, the verify failbit count circuit of the present disclosure may further include an intermediate higher bit counter. FIG. 15 is a schematic structure diagram of an intermediate higher bit counter in a verify failbit count circuit according to an implementation of the present disclosure. Referring to FIG. 15, the intermediate higher bit counter 1050 includes three input terminals 1505-1507 and three output terminals 1508-1510. Wherein the verify failbit signal Verok_q is connected to the input terminal 1506. In an implementation including the intermediate higher bit counter 1050, the first intermediate bit counter 1040 also outputs a third enable signal A<1> according to the comparison result and is connected to the input terminal 1505, the third enable signal A<1> is used to control the intermediate higher bit counter 1050 to be turned on or turned off; the third reference signal Ibase_2 is connected to the input terminal 1507. When the intermediate higher bit counter 1050 is turned on, the intermediate higher bit counter 1050 compares the verify failbit signal Verok_q with the third reference signal Ibase_2 to generate a fourth comparison result Vercont<2>. In the implementation shown in FIG. 7, the output terminals 1508-1510 respectively output AB<2>, enable signal A<2>, and Vercont<2>, wherein, when the fourth enable signal A<max>=1, the fourth comparison result Vercont<2> is equal to the enable signal A<2>.

In some implementations, v the third reference signal Ibase_2 is greater than the second reference signal Ibase_1, and the third reference signal Ibase_2 is less than or equal to the verify standard signal Ver_s. Structurally, the intermediate higher bit counter 1050 is adjacent to the first intermediate bit counter 1040.

In the implementation shown in FIG. 15, the third reference signal Ibase_2 corresponds to 12b, i.e., 12 times of the standard current. In some implementations, the intermediate higher bit counter 1050 corresponds to a counter in a verify failbit count circuit with a reference signal being at an intermediate level, and the fourth comparison result Vercont<2> output by this counter is the second bit of the final output result, which is adjacent to the first bit and the third bit.

For the implementation shown in FIG. 15, since the third reference signal Ibase_2 is greater than 10b, if the intermediate higher bit counter 1050 is turned on, a greater verify standard signal Ver_s must be selected in the highest bit counter 1020 shown in FIG. 11B, i.e., the verify standard signal Ver_s corresponds to 27b.

With reference to FIG. 14 and FIG. 15, when the verify failbit signal Verok_q is greater than the second reference signal Ibase_1, the third comparison result Vercont<1> output by the first intermediate bit counter 1040 is 1, and the third enable signal A<1> is also 1, the intermediate higher bit counter 1050 is turned on. If the verify failbit signal Verok_q is less than the second reference signal Ibase_1, the third comparison result Vercont<1> output by the first intermediate bit counter 1040 is 0, the third enable signal A<1> is also 0, and the intermediate higher bit counter 1050 is turned off.

According to the implementation described above, when the verify failbit signal Verok_q is greater than the first reference signal Ibase_0, the first intermediate bit counter 1040 can be turned on, and when the verify failbit signal Verok_q is greater than the second reference signal Ibase_1, the intermediate higher bit counter 1050 can be turned on. That is, the first intermediate bit counter 1040 and the middle higher bit counter 1050 are only turned on when necessary, and turned off when not necessary, thereby power consumption can be saved.

As can be seen from the structure described above, in some implementations, each of the at least one intermediate bit counters has the same structure with the lowest bit counter.

In some implementations, the highest bit counter 1020 is further configured to: output a fourth enable signal A<max> according to the result of the first comparison; the lowest bit counter 1030 further includes a first OR gate 1204, the two input terminals of the first OR gate are respectively connected to the fourth enable signal and the second enable signal, and the output of the first OR gate is used as the second comparison result output by the lowest bit counter.

In some implementations, the first intermediate bit counter 1040 of the at least one intermediate bit counter further includes a second OR gate 1410, the input terminal of the second OR gate is connected to the fourth enable signal and the third enable signal, and the output of the second OR gate is used as the third comparison result output by the intermediate bit counter.

According to the implementation described above, the lowest bit counter 1030 represents the lowest bit counter of a plurality of counters, the first intermediate bit counter 1040 represents a lower bit counter of the plurality of counters, and the intermediate higher bit counter 1050 represents a higher bit counter of the plurality of counters, the highest bit counter 1020 represents a highest bit counter of the plurality of counters.

In some implementations, when the first intermediate bit counter 1040 is turned on, the lowest bit counter 1030 is turned off, thereby further saving power consumption.

In some implementations, when the intermediate higher bit counter 1050 is turned on, the first intermediate bit counter 1040 is turned off, thereby further saving power consumption.

Referring to FIG. 11B, in some implementations, the highest bit counter 1020 of the present disclosure also outputs a fourth enable signal A<max> according to the result of the first comparison Vercont<13>. As shown in FIG. 12, the lowest bit counter 1030 of this implementation also includes a first OR gate 1204, the input terminal of the first OR gate 1204 is connected to the fourth enable signal A<max> and the second enable signal A<0>, the output of the first OR gate 1204 is the second comparison result Vercont<0>. As shown in FIG. 14, the first intermediate bit counter 1040 of this implementation also includes a second OR gate 1404, the input terminal of the second OR gate 1404 is connected to the fourth enable signal A<max> and the third enable signal A<1>, the output of the second OR gate 1404 is the third comparison result Vercont<1>.

As shown in FIG. 10, in addition to being connected to the lowest bit counter 1030, the highest bit counter 1020 is also connected to the first intermediate bit counter 1040 and the intermediate higher bit counter 1050 to output the fourth enable signal A<max> to each counter. It can be understood that, for an implementation with a plurality of counters, the highest bit counter 1020 outputs the fourth enable signal A<max> to each counter.

According to the implementation described above, no matter what the verify standard signal Ver_s is, when the verify failbit signal Verok_q is greater than the verify standard signal Ver_s, the fourth enable signal A<max>=1, then regardless of the comparison results of the lowest bit counter 1030 and the first intermediate bit counter 1040, the second comparison result Vercont<0> finally output and the third comparison result Vercont<1> are both 1. At this time, since the first enable signal AB<max>=0, the lowest bit counter 1030 is turned off, and accordingly, the first intermediate bit counter 1040 and the intermediate higher bit counter 1050 are also turned off.

In some implementations, as shown in FIG. 16, the intermediate higher bit counter 1050 further includes a third OR gate 1504, and the input terminal of the third OR gate 1504 is connected to the fourth enable signal A<max> and a next bit enable signal A<2> output by the intermediate higher bit counter 1050, the output of the third OR gate 1504 is the fourth comparison result Vercont<2>. The next-bit enable signal A<2> here can be used as an enable signal of a counter for the higher bit adjacent to the middle higher bit counter 1050. When A<max>=0, Vercont<2>=A<2>. If there is no higher bit counter adjacent to the intermediate higher bit counter 1050, A<2> will not be used as an enable signal.

Figure 16A:
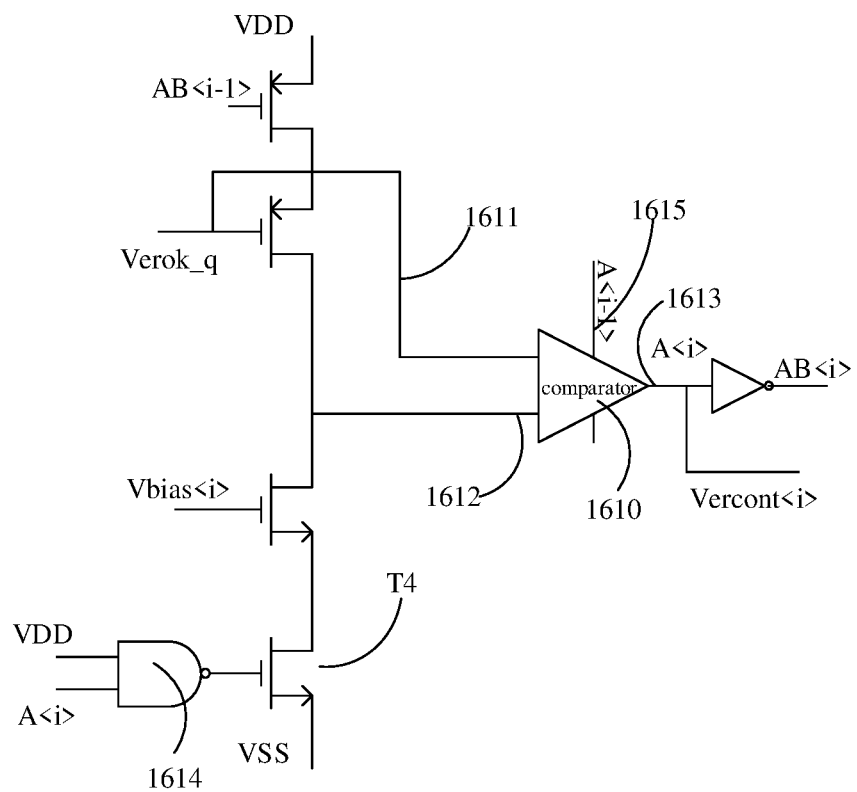
FIGS. 16A and 16B are schematic structure diagrams of an intermediate bit counter in a verify failbit count circuit according to an implementation of the present disclosure.
Figure 16B:
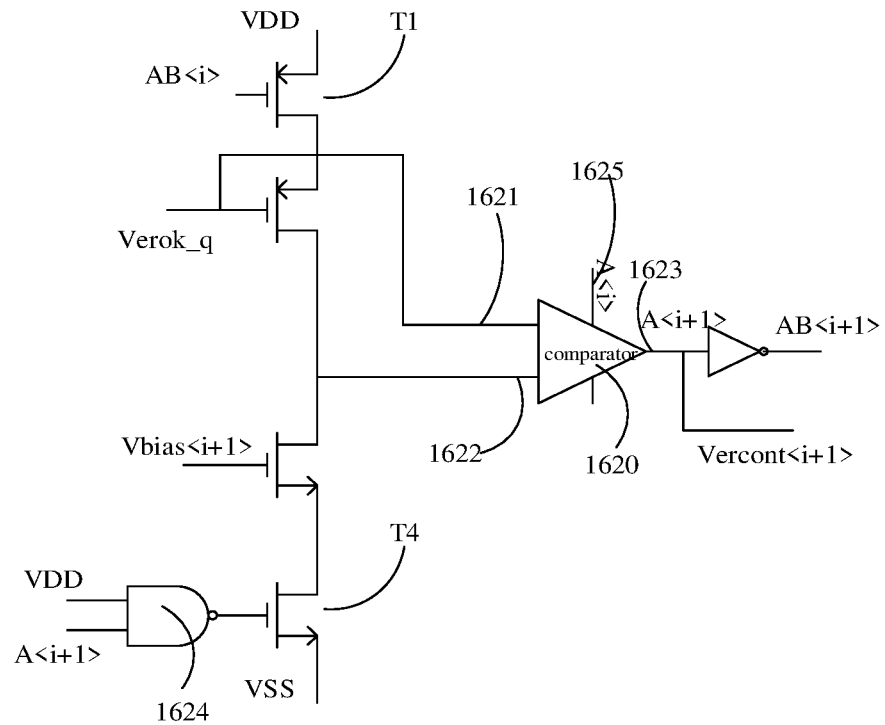

FIG. 16A is a schematic structure diagram of an intermediate bit counter in a verify failbit count circuit according to an implementation of the present disclosure. FIG. 16B is a schematic structure diagram of an intermediate higher bit counter in a verify failbit count circuit according to an implementation of the present disclosure. In general, the working principle of the count circuit is: the lowest enable signal is given by a direct control logic unit, the initial state of the count circuit will be assigned, and the enable signal of the next-level comparator will be turned on in turn through the comparison of the lower quantization unit, i.e., if the output of the current counter is high, it is directly assigned to the enable signal of the next-level comparator. The verify failbit count circuit in this implementation includes a plurality of intermediate bit counters and intermediate higher bit counters, corresponding to the counters whose reference signal is at the middle level, the intermediate bit counters and the intermediate higher bit counters are adjacent to each other. In FIG. 16A, the i-th counter is used to represent an intermediate bit counter, and in FIG. 16B, the (i+1)-th counter is used to represent an intermediate higher bit counter. In this implementation, assuming that the counters are connected sequentially in the order of reference signals from low to high, the reference signal of the i-th counter is less than the reference signal of the (i+1)-th counter.

Referring to FIG. 16A, the i-th counter mainly includes a comparator 1610. The comparator 1610 includes three input terminals, wherein the input terminal 1611 is connected to the verify failbit signal Verok_q, the input terminal 1615 is connected to the enable signal A<i−1> output by the (i−1)-th counter, and the input terminal 1612 is connected to the reference signal Vbias<i>, the output terminal 1613 outputs the comparison result Vercont<i>. Wherein, the (i−1)-th counter can be an intermediate bit counter, which corresponds to a reference signal less than the reference signal of the i-th counter, and the i-th counter is an intermediate higher bit counter. Wherein the i-th counter also includes a control circuit and an inverter, the specific functions of which have been described above and will not be repeated here.

For the i-th counter, the enable signal A<i−1> output by the (i−1)-th counter is used as the enable signal of the i-th counter. When the verify failbit signal Verok_q is greater than the reference signal of the (i−1)-th counter, the enable signal A<i−1>=1, thus the i-th counter is turned on. The i-th counter compares the verify failbit signal Verok_q with the reference signal Vbias<i>, if the verify failbit signal Verok_q is greater than the reference signal Vbias<i>, the comparison result of the i-th counter Vercont<i>=1, and the enable signal A<i>=1. The enable signal A<i> is also connected, together with the system voltage VDD, to the base of the N-type transistor T4 through the NAND gate 1614, and when the enable signal A<i>=1, the output of the NAND gate 1614 is 0 to turn off the N Type transistor T4, thereby the i-th counter is turned off.

Referring to FIG. 16B, the (i+1)-th counter mainly includes a comparator 1620. The comparator 1620 includes three input terminals, wherein the input terminal 1622 is connected to the verify failbit signal Verok_q, the input terminal 1625 is connected to the enable signal A<i> output by the i-th counter, and the input terminal 1621 is connected to the reference signal Vbias<i+1>, the output terminal 1613 outputs the comparison result Vercont<i+1>. When the i-th counter is an intermediate bit counter, the (i+1)-th counter is an intermediate higher bit counter. Wherein the (i+1)-th counter also includes a control circuit and an inverter, the specific functions of which have been described above and will not be repeated here.

When the enable signal A<i>=1, the P-type transistor T1 is turned on, thereby the (i+1)-th counter is turned on. The reference signal Vbias<i+1> of the (i+1)-th counter is greater than the reference signal Vbias<i> of the i-th counter. The (i+1)-th counter then compares the verify failbit signal Verok_q with the reference signal Vbias<i+1>, and if the verify failbit signal Verok_q is less than the reference signal Vbias<i+1>, the comparator 1620 outputs the enable signal A<i+1>=0; otherwise, outputs the enable signal A<i+1>=1. The enable signal A<i+1> is also connected, together with the system voltage VDD, to the base of the N-type transistor T4 through the NAND gate 1624, and when the enable signal A<i+1>=1, the output of the NAND gate 1624 is 0 to turn off the N Type transistor T4, thereby the (i+1)-th counter is turned off.

According to the counters shown in FIGS. 16A and 16B, only one of the plurality of counters can be turned on according to the relationship between the verify failbit signal Verok_q and the reference signal, thereby saving power consumption to the greatest extent and improving efficiency.

In some implementations, the count circuit 200 further includes a code converter 1060 configured to: convert thermometer code into a binary code; wherein the input of the code converter is sequentially the result of the first comparison, the third comparison result and the second comparison result from high bit to low bit.

In some implementations, the count circuit 200 further includes an accumulator 1070 configured to accumulate a plurality of binary codes obtained from the code converter.

It should be noted that the verify failbit count circuit of an implementation of the present disclosure may also include a code converter, the code converter is suitable for converting thermometer code into a binary code, and the input of the code converter is sequentially the result of the first comparison, the third comparison result and the second comparison result from high bit to low bit. A verify failbit count circuit of an implementation of the present disclosure may further include an accumulator, the accumulator is suitable for accumulating a plurality of binary codes obtained from code converter.

Referring to FIG. 10, in this verify failbit count circuit 200, each of counters outputs the comparison result to the code converter 1060, and the code converter 1060 transmits the converted binary code to the accumulator 1070, the accumulator 1070 accumulates a plurality of binary codes and outputs the final result.

Figure 17:
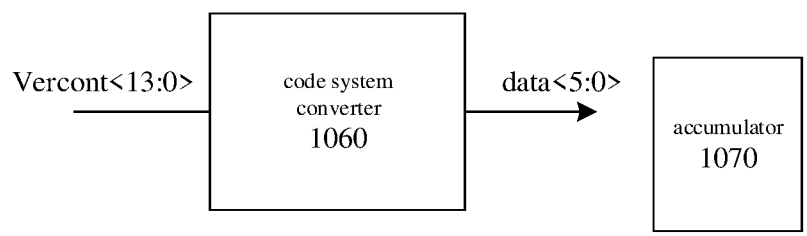
FIG. 17 is a schematic structure diagram of a code converter and an accumulator in a verify failbit count circuit according to an implementation of the present disclosure.

FIG. 17 is a schematic structure diagram of a code converter and an accumulator in a verify failbit count circuit according to an implementation of the present disclosure. Referring to FIG. 17, the input terminal of the code converter 1060 is connected to the plurality of comparison results of the counter described above. According to the implementation described above, the comparison results of the 14 counters can be represented by Vercont<0:13>, wherein Vercont<13> is a result of the first comparison output by the highest bit counter 1020, indicating the highest bit; Vercont<0> is a second comparison result output by the lowest bit counter 1030, indicating the lowest bit; Vercont<1:12> is the third comparison result output by a plurality of first intermediate bit counters 1040, which may also be divided into lower bits and higher bits, and the lower bits are a third comparison result output by the first intermediate bit counter 1040, and the higher bits are a fourth comparison result output by the intermediate higher bit counter 1050.

The result of the first comparison, the third comparison result and the second comparison result can be represented as high bits to low bits of thermometer code in sequence. For the implementation including the fourth comparison result, the result of the first comparison, the third comparison result, the fourth comparison result and the second comparison result can be represented as high bits to low bits of thermometer code in sequence.

In the implementation shown in FIG. 17, the output terminal of the code converter 1060 is a 6-bit binary code data <5:0>. FIG. 17 is not used to limit the specific number of bits of the binary code.

The binary code data<5:0> is input to the accumulator 1070. In some implementations, verify failbit count can be performed on a semiconductor memory device a plurality of times, and the verify failbit count circuit of the present disclosure is employed to obtain failbit counts each time. The accumulator 1070 may accumulate a plurality of failbit count results as the final count result of the semiconductor memory device. Due to a plurality of verify failbit counts, the current required for each quantization is small, thereby further reducing the power consumption of the circuit.

Figure 18:
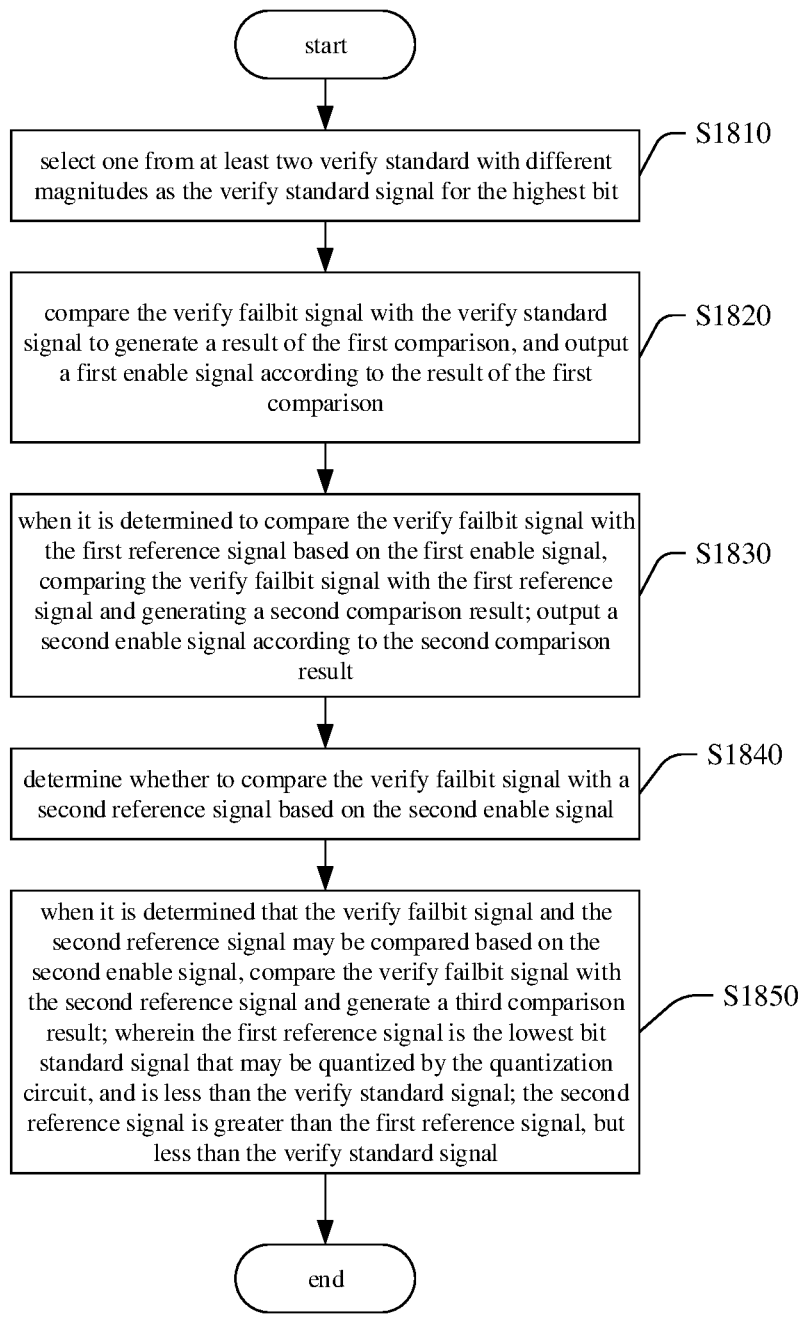
FIG. 18 is an exemplary flowchart of a verify failbit quantification method for a semiconductor memory according to an implementation of the present disclosure.

Based on the same inventive concept, FIG. 18 is an exemplary flowchart of a verify failbit quantification method for a semiconductor memory according to an implementation of the present disclosure. The verify failbit quantification method can be executed by the verify failbit count circuit described above, so the drawings and related descriptions described above can be used to illustrate the verify failbit quantification method of this implementation, and the repeated content will not be elaborated. Referring to FIG. 18, the verify failbit count method of this implementation includes the following steps:

Step S1810: selecting one from at least two verify standard with different magnitudes as the verify standard signal for the highest bit.

This step can be performed by the verify standard selector 1004 shown in FIG. 11A.

Step S1820: comparing the verify failbit signal with the verify standard signal to generate a result of the first comparison, and outputting a first enable signal according to the result of the first comparison; determining whether to compare the verify failbit signal with the first reference signal based on the first enable signal.

This step can be performed by the highest bit counter 1020 shown in FIG. 11B. The lowest bit counter in this step can be the lowest bit counter 1030 shown in FIG. 10.

Step S1830: when it is determined to compare the verify failbit signal with the first reference signal based on the first enable signal, comparing the verify failbit signal with the first reference signal and generating a second comparison result; outputting a second enable signal according to the second comparison result.

The intermediate bit counter in this step can be the first intermediate bit counter 1040 shown in FIG. 10.

Step S1840: determining whether to compare the verify failbit signal with a second reference signal based on the second enable signal.

Step S1850: when it is determined that the verify failbit signal and the second reference signal can be compared based on the second enable signal, comparing the verify failbit signal with the second reference signal and generating a third comparison result; wherein the first reference signal is the lowest bit standard signal that can be processed by the count circuit, and is less than the verify standard signal; the second reference signal is greater than the first reference signal, but less than the verify standard signal.

In some implementations, the method further includes: outputting a third enable signal according to the third comparison result; determining whether to compare the verify failbit signal with a third reference signal based on the third enable signal; when it is determined to compare the verify failbit signal with the third reference signal based on the third enable signal, comparing the verify failbit signal with the third reference signal and generating a fourth comparison result; wherein the third reference signal is greater than the second reference signal and less than or equal to the verify standard signal.

In some implementations, determining whether to compare the verify failbit signal with the first reference signal based on the first enable signal includes: when the verify failbit signal is less than the verify standard signal, it is determined to compare the verify failbit signal with the first reference signal based on the first enable signal; controlling the lowest bit counter to be turned on; when the verify failbit signal is not less than the verify standard signal, it is determined that the verify failbit signal is not compared with the first reference signal based on the first enable signal.

In some implementations, determining whether to compare the verify failbit signal with the second reference signal based on the second enable signal includes: when the verify failbit signal is greater than the first reference signal, it is determined to compare the verify failbit signal with the second reference signal based on the second enable signal; when the verify failbit signal is not greater than the first reference signal, it is determined that the verify failbit signal is not compared with the second reference signal based on the second enable signal.

In some implementations, the method further includes: when comparing the verify failbit signal with the second reference signal and generating a third comparison result, turning off the lowest bit counter corresponding to the result of the first comparison.

In some implementations, determining whether to compare the verify failbit signal with the third reference signal based on the third enable signal includes: when the verify failbit signal is greater than the second reference signal, it is determined to compare the verify failbit signal with the third reference signal based on the third enable signal; when the verify failbit signal is not greater than the second reference signal, it is determined that the verify failbit signal is not compared with the third reference signal based on the third enable signal.

In some implementations, the method further includes: when comparing the verify failbit signal with the third reference signal and generating a fourth comparison result, turning off the intermediate bit counter corresponding to the third comparison result.

In some implementations, the method further includes: outputting a fourth enable signal according to the result of the first comparison; when the verify failbit signal is greater than the verify standard signal, determining, based on the fourth enable signal, at least one of: whether to compare the verify failbit signal with a first reference signal; whether to compare the verify failbit signal with a second reference signal; whether to compare the verify failbit signal with a third reference signal.

In some implementations, when the verify failbit signal is less than the verify standard signal, the first enable signal causes the lowest bit counter to be turned on.

In some implementations, when the verify failbit signal is greater than the first reference signal, the second enable signal causes the intermediate bit counter to be turned on.

In some implementations, when the intermediate bit counter is controlled to be turned on, the lowest bit counter is turned off.

In some implementations, when the verify failbit signal is greater than the second reference signal, the third enable signal causes the intermediate higher bit counter to be turned on.

In some implementations, when the intermediate higher bit counter is controlled to be turned on, the intermediate bit counter is turned off.

In some implementations, the method further includes: outputting a fourth enable signal according to the result of the first comparison; and when the verify failbit signal is greater than the verify standard signal, the fourth enable signal causes the lowest bit counter, the intermediate bit counter and the intermediate higher bit counter to be turned off.

According to verify failbit quantification methods of implementations of the present disclosure, the verify standard signal can be flexibly switched, and only necessary counters are turned on and unnecessary counters are turned off according to the magnitude of the actual verify failbit signal, which may minimize the power consumed by the verify failbit count function.

Figure 19:
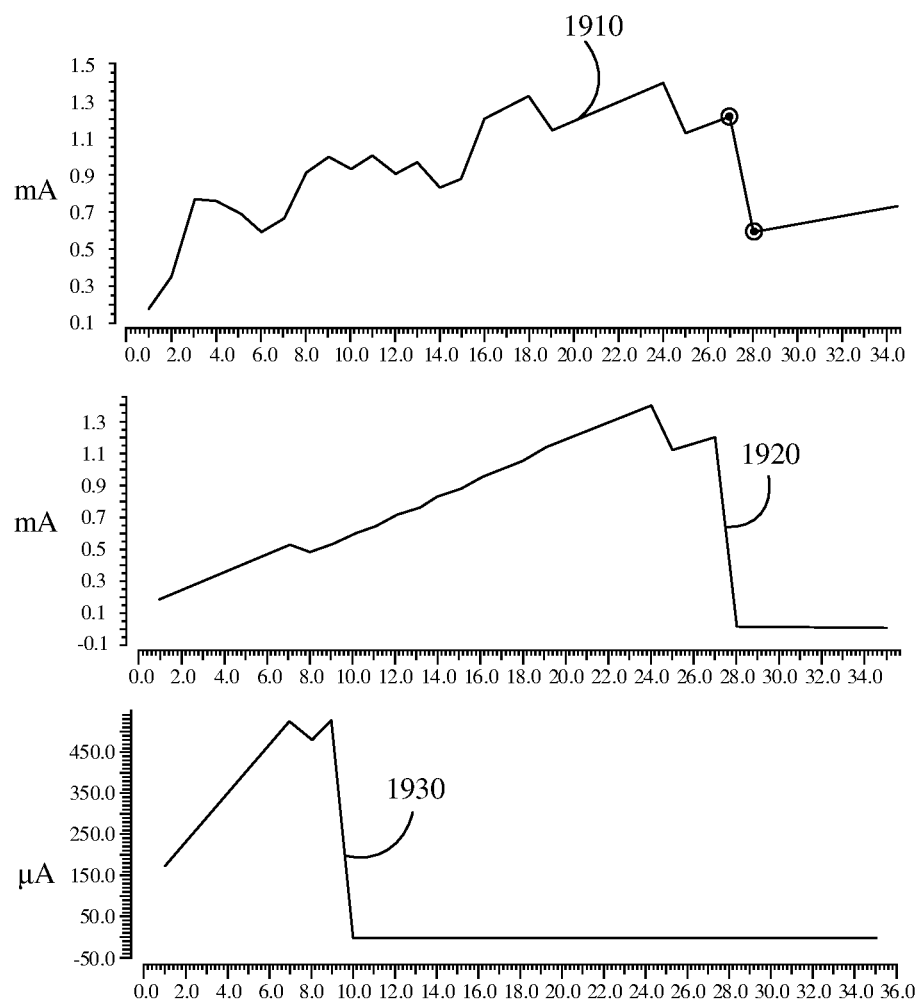
FIG. 19 is a schematic diagram of a power consumption test result of a verify failbit count circuit and method according to an implementation of the present disclosure.

FIG. 19 is a schematic diagram of a power consumption test result of a verify failbit count circuit and method according to an implementation of the present disclosure. This includes three curves in three coordinate systems. In each coordinate system, the horizontal axis is the count value of failed bits, and the vertical axis is the average of current, a lower average of current indicates a lower power consumption corresponding to the test result. Curve 1910 is the power consumption test result of the current VFC circuit, and the unit of the vertical axis is mA; curve 1920 is the power consumption test result where the verify failbit quantification circuit and method of the present disclosure are employed and the verify standard is 25b, and the unit of the vertical axis is mA; the curve 1930 is the power consumption test result where the verify failbit quantification circuit and method of the present disclosure are employed and the verify standard is 10b, and the unit of the vertical axis is μA. Referring to FIG. 19, it is obvious that the power consumption shown by curve 1930 is the smallest. Table 1 below is the result obtained by comparing the current peak value (peak I) and the current average value (average I) obtained according to the curves 1910, 1920, and 1930 in FIG. 19.

TABLE 1

| Failbit count | 6(peak I) | 11(peak I) | 16(peak I) | 16-6(average I) |
|---|---|---|---|---|
| Employ existing VFC circuit | 0.59 | 1 | 1.2 | 0.05107 |
| Employ the present disclosure (Verify standard: 25b) | 0.471 | 0.636 | 0.949 | 0.04057 |
| Employ the present disclosure (Verify standard: 10b) | 0.471 | 0 | 0 | 0.00337 |

In Table 1, "6 (peak I)" indicates the current peak value when the failbit count=6, "11 (peak I)" indicates the current peak value when the failbit count=11, "16 (peak I)" indicates the current peak value when the failbit count=16, "16-6 (average I)" indicates the current average value when the failbit count is between 6-16.

According to the results in Table 1, for a die including 4 planes and each plane including 8 units, when the verify standard is 25b, the current peak value of each unit can be saved by 0.364 mA. When the failbit count=11, the current peak may save a total of 11.648 mA. When the verify standard is 10b, the peak current of each unit save 1.2 mA. When the failbit count=16, the current peak may save a total of 38.4 mA.

Compared with the current VFC circuit, when the verify standard is 25b, the average of current can be reduced by I_sp=10.5 uA; when the verify standard is 10b, the average of current can be reduced by I_sp=47.7 uA.

Based on the same inventive concepts, the present disclosure also provides a memory device, including a memory array and a peripheral circuit for controlling the memory array, wherein, The peripheral circuit includes a semiconductor memory verify failbit count circuit, the count circuit including: a highest bit counter, a lowest bit counter and at least one intermediate bit counter, wherein: the highest bit counter is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit; the lowest bit counter is connected to the highest bit counter, and is configured to: receive the first enable signal, the verify failbit signal and the first reference signal; compare the verify failbit signal with the first reference signal to generate a second comparison result based on the first enable signal being enabled; output a second enable signal according to the second comparison result; a first intermediate bit counter of the at least one intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; wherein the first reference signal is the lowest bit standard signal that can be processed by the count circuit, and is less than the verify standard signal; the second reference signal is greater than the first reference signal, but less than the verify standard signal.

It should be noted that the memory device is the memory including the count circuit described above, and terms appearing in the memory are explained in detail in the count circuit described above, and are also applicable here, thus will not be repeated here. It should be understood that only the structure of the memory device most relevant to the technology of the present invention is described here, and other structures can be the structures shown in FIGS. 1 to 6 described above, or other memory structures.

Based on the same inventive concepts, the present disclosure also provides a memory system, including a memory and a controller for controlling the memory, wherein the memory device includes a memory array and a peripheral circuit for controlling the memory array, wherein, the peripheral circuit includes a semiconductor memory verify failbit count circuit, the count circuit including: a highest bit counter, a lowest bit counter and at least one intermediate bit counter, wherein: the highest bit counter is configured to: receive a verify standard signal and a verify failbit signal; compare the verify standard signal with the verify failbit signal to generate a result of the first comparison; output a first enable signal according to the result of the first comparison; the verify standard signal is the highest bit standard signal that can be quantified by the count circuit; the lowest bit counter is connected to the highest bit counter, and is configured to: receive the first enable signal, the verify failbit signal and the first reference signal; compare the verify failbit signal with the first reference signal to generate a second comparison result based on the first enable signal being enabled; output a second enable signal according to the second comparison result; a first intermediate bit counter of the at least one intermediate bit counter is connected to the lowest bit counter and is configured to: receive the second enable signal, the verify failbit signal and a second reference signal; compare the verify failbit signal with the second reference signal to generate a third comparison result based on the second enable signal being enabled; wherein the first reference signal is the lowest bit standard signal that can be processed by the count circuit, and is less than the verify standard signal; the second reference signal is greater than the first reference signal, but less than the verify standard signal.

In some implementations, the memory system is a solid state drive (SSD) or a memory card.

It should be noted that the memory system includes the memory devices described above, therefore, the two have the same technical features, and terms appearing in the memory system are explained in detail in the memory device described above, and are also applicable here, thus will not be repeated here. It should be understood that only the structure of the memory device most relevant to the technology of the present disclosure is described here, and other structures can be the structures shown in FIGS. 1 to 6 described above, or other memory structures.

Although the present disclosure has been described with reference to the current specific implementations, those of ordinary skill in the art should recognize that the implementations described above are only for illustration of the present disclosure, and various equivalent changes or substitutions can also be made without departing from the spirit of the present disclosure, therefore, changes and modifications to the implementations described above will all fall within the scope of the claims of the present disclosure as long as they are within the true spirit of the present disclosure.

What is claimed is:

1. A circuit for verifying failbit count in a semiconductor memory device, comprising:
a highest bit counter configured to:
receive a verify standard signal and a verify failbit signal, wherein the verify standard signal is a highest bit standard signal of the circuit;
compare the verify standard signal with the verify failbit signal to generate a first comparison result, and
output a first enable signal based on the first comparison result;
a lowest bit counter being connected to the highest bit counter and configured to:
receive the first enable signal, the verify failbit signal, and a first reference signal, wherein the first reference signal is a lowest bit standard signal of the circuit,
in response to the first enable signal indicating to enable the lowest bit counter, compare the verify failbit signal with the first reference signal to generate a second comparison result, and
output a second enable signal based on the second comparison result; and
a first intermediate bit counter connected to the lowest bit counter and configured to:
receive the second enable signal, the verify failbit signal, and a second reference signal higher than the first reference signal and lower than the verify standard signal, and
in response to the second enable signal indicating to enable the first intermediate bit counter, compare the verify failbit signal with the second reference signal to generate a third comparison result.

2. The circuit of claim 1, further comprising:
a plurality of intermediate bit counters that are connected sequentially based on their respective reference signals from low to high, wherein:
a reference signal of lower intermediate bit counter is lower than a reference signal of a higher intermediate bit counter,
a switch between an enabled status and a disabled status of each intermediate bit counter is controlled by its adjacent lower intermediate bit counter.

3. The circuit of claim 2, wherein the plurality of intermediate bit counters comprises:
a second intermediate bit counter arranged adjacent to the first intermediate bit counter, and configured to:
receive a third enable signal output by the first intermediate bit counter based on the third comparison result,
receive the verify failbit signal, and a third reference signal higher than the second reference signal and lower than or equal to the verify standard signal, and
in response to the third enable signal indicating to enable the second intermediate bit counter, compare the verify failbit signal with the third reference signal to generate a fourth comparison result.

4. The circuit of claim 3, wherein the highest bit counter comprises:
a first comparator configured to:
receive the verify standard signal and the verify failbit signal,
compare the verify standard signal with the verify failbit signal to generate the first comparison result, and
output the first comparison result; and
a first inverter connected to the first comparator and configured to:
receive the first comparison result, and
output the first enable signal based on the first comparison result, wherein the first enable signal is an inverse signal of the first comparison result.

5. The circuit of claim 4, wherein the lowest bit counter comprises:
a first control circuit connected to the highest bit counter and configured to:
receive the first enable signal, and
control a switch between an enabled status and a disabled status of the lowest bit counter based on the first enable signal; and
a second comparator configured to:
receive the verify failbit signal and the first reference signal when the lowest bit counter is in the enabled status, and
compare the verify failbit signal with the first reference signal to generate the second comparison result.

6. The circuit of claim 5, wherein the second comparator is further configured to:
output the second enable signal based on the second comparison result, wherein the second enable signal is in phase with the second comparison result.

7. The circuit of claim 5, wherein the first control circuit comprises a P-type transistor T1, a P-type transistor T2, and an N-type transistor T3, wherein:
a drain of the P-type transistor T1 is connected to a source of the P-type transistor T2;
a drain of the P-type transistor T2 is connected to a drain of the N-type transistor T3;
a base of the P-type transistor T1 is connected to an output terminal of the first inverter;
a base and the drain of the P-type transistor T2 are connected to the verify failbit signal;
a base of the N-type transistor T3 is connected to the first reference signal; and
the P-type transistor T1 is turned on or turned off based on the first enable signal to control the switch between the enabled status and the disabled status of the lowest bit counter.

8. The circuit of claim 7, wherein the first control circuit further comprises an N-type transistor T4 and a first NAND gate; wherein:
a drain of the N-type transistor T4 is connected to a source of the N-type transistor T3;
a base of the N-type transistor T4 is connected to an output terminal of the first NAND gate; and
the N-type transistor T4 is turned off when the first NAND gate outputs a low level signal to turn off the lowest bit counter.

9. The circuit of claim 8, wherein the first NAND gate comprises:
a first input terminal connected to a system voltage VDD; and
a second input terminal connected to the second enable signal.

10. The circuit of claim 9, wherein each of the plurality of intermediate bit counters has a same structure with the lowest bit counter.

11. The circuit of claim 5, wherein:
the highest bit counter is further configured to: output a fourth enable signal based on the result of the first comparison; and the lowest bit counter further includes a first OR gate, two input terminals of the first OR gate are respectively connected to the fourth enable signal and the second enable signal respectively, and an output of the first OR gate is used as the second comparison result output by the lowest bit counter.

12. The circuit of claim 10, wherein:
the highest bit counter is further configured to output a fourth enable signal based on the result of the first comparison;
the first intermediate bit counter further includes a second OR gate, two input terminals of the second OR gate are respectively connected to the fourth enable signal and the third enable signal, and an output of the second OR gate is used as the third comparison result output by the first intermediate bit counter.

13. The circuit of claim 1, further comprising:
a code converter configured to convert a thermometer code into a binary code, wherein the first comparison result, the third comparison result, and the second comparison result are inputs of the code converter from high bit to low bit.

14. The circuit of claim 13, further comprising:
an accumulator configured to accumulate a plurality of binary codes obtained from the code converter.

15. The circuit of claim 1, further comprising:
a verify standard selector configured to select one from at least two verify standards with different magnitudes as the verify standard signal.

16. A method for verifying failbit count in a semiconductor memory by a circuit, comprising:
selecting one from at least two verify standards with different magnitudes as a verify standard signal for a highest bit;
comparing a verify failbit signal with the verify standard signal to generate a first comparison result;
outputting a first enable signal based on the result of the first comparison;
determining whether to compare the verify failbit signal with a first reference signal based on the first enable signal, wherein the first reference signal is a lowest bit standard signal of the circuit and is less than the verify standard signal;
comparing the verify failbit signal with the first reference signal to generate a second comparison result;
outputting a second enable signal based on the second comparison result;
determining whether to compare the verify failbit signal with a second reference signal based on the second enable signal, wherein second reference signal higher than the first reference signal and lower than the verify standard signal; and
comparing the verify failbit signal with the second reference signal to generate a third comparison result.

17. The method of claim 16, further comprising:
outputting a third enable signal based on the third comparison result;
determining whether to compare the verify failbit signal with a third reference signal based on the third enable signal, wherein third reference signal is higher than the second reference signal and lower than or equal to the verify standard signal; and
comparing the verify failbit signal with the third reference signal to generate a fourth comparison result.

18. The method of claim 17, further comprising:
outputting a fourth enable signal based on the first comparison result; and
when the verify failbit signal is higher than the verify standard signal, determining, based on the fourth enable signal, at least one of:
whether to compare the verify failbit signal with the first reference signal,
whether to compare the verify failbit signal with the second reference signal, and
whether to compare the verify failbit signal with the third reference signal.

19. A memory device, comprising:
a memory array; and
a peripheral circuit for controlling the memory array, wherein the peripheral circuit comprises:
a circuit for verifying failbit count, comprising:
a highest bit counter configured to: receive a verify standard signal and a verify failbit signal, wherein the verify standard signal is a highest bit standard signal that is quantified by the circuit, compare the verify standard signal with the verify failbit signal to generate a first comparison result, and output a first enable signal based on the first comparison result;
a lowest bit counter being connected to the highest bit counter and configured to: receive the first enable signal, the verify failbit signal, and a first reference signal, wherein the first reference signal is a lowest bit standard signal that is quantified by the circuit, in response to the first enable signal indicating an enable status, compare the verify failbit signal with the first reference signal to generate a second comparison result, and output a second enable signal based on the second comparison result; and
at least one intermediate bit counter each being connected to the lowest bit counter and configured to: receive the second enable signal, the verify failbit signal, and a second reference signal higher than the first reference signal and lower than the verify standard signal, and in response to the first enable signal indicating an enable status, compare the verify failbit signal with the second reference signal to generate a third comparison result.

* * * * *